United States Patent
Saito et al.

(10) Patent No.: US 6,635,366 B2
(45) Date of Patent: Oct. 21, 2003

(54) SPIN VALVE THIN FILM MAGNETIC ELEMENT AND THIN FILM MAGNETIC HEAD

(75) Inventors: Masamichi Saito, Niigata-ken (JP); Kenichi Tanaka, Niigata-ken (JP); Yosuke Ide, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 288 days.

(21) Appl. No.: 09/728,069

(22) Filed: Nov. 30, 2000

(65) Prior Publication Data
US 2001/0003023 A1 Jun. 7, 2001

(30) Foreign Application Priority Data
Dec. 6, 1999 (JP) .......................... 11-346931

(51) Int. Cl.⁷ ................................ G11B 5/66
(52) U.S. Cl. .......... 428/692; 428/694 R; 428/694 TN; 428/694 TS; 428/900; 360/113; 338/32 R; 338/32 M; 324/252
(58) Field of Search ............. 428/694 R, 694 TM, 428/694 TS, 682–900; 360/113; 338/32 R, 32 M; 324/252

(56) References Cited

U.S. PATENT DOCUMENTS

| | | | |
|---|---|---|---|
| 5,408,377 A | * 4/1995 | Gurney et al. | 360/113 |
| 6,133,732 A | * 10/2000 | Hayashi | 324/252 |
| 6,153,062 A | * 11/2000 | Saito et al. | 204/192.2 |
| 6,198,378 B1 | * 3/2001 | Saito et al. | 338/32 R |
| 6,201,465 B1 | * 3/2001 | Saito et al. | 338/32 R |
| 6,221,172 B1 | * 4/2001 | Saito et al. | 148/108 |
| 6,424,506 B1 | * 7/2002 | Saito et al. | 360/324.11 |
| 6,483,674 B1 | * 11/2002 | Kanai et al. | 360/324.12 |
| 6,549,384 B2 | * 4/2003 | Saito et al. | 360/324.11 |

FOREIGN PATENT DOCUMENTS

JP 3040750 3/2000

OTHER PUBLICATIONS

1996 Digests of INTERMAG '96; 1996 IEEE International Magnetics Conference; Apr. 9–12, 1996, Seattle, WA USA; Session AA–04; Spin Valves with Synthetic Ferrimagnets; V.S. Speriosu et al.

* cited by examiner

Primary Examiner—Leszek Kiliman
(74) Attorney, Agent, or Firm—Brinks Hofer Gilson & Lione

(57) ABSTRACT

A spin valve thin film magnetic element is provided composed of an antiferromagnetic layer; a pinned magnetic layer, formed in contact with the antiferromagnetic layer, in which the direction of magnetization is pinned by an exchange coupling magnetic field with the antiferromagnetic layer; a nonmagnetic conductive layer in contact with the pinned magnetic layer; and a free magnetic layer in contact with the nonmagnetic conductive layer, wherein the free magnetic layer is composed of a nonmagnetic intermediate layer, and the first and second free magnetic layers holding the nonmagnetic intermediate layer therebetween; the first free magnetic layer and the second free magnetic layer are antiferromagnetically coupled to enter the ferrimagnetic state; and a resistivity of the first free magnetic layer in the side farther from the nonmagnetic intermediate layer is higher than a resistivity of the second free magnetic layer in the nonmagnetic intermediate layer side. According to the spin valve thin film magnetic element, it is possible to increase the detection sensitivity for the external magnetic field, to reduce the shunt loss of the sensing current, and to increase the rate of change in magnetoresistance.

14 Claims, 15 Drawing Sheets

FIG. 16
PRIOR ART
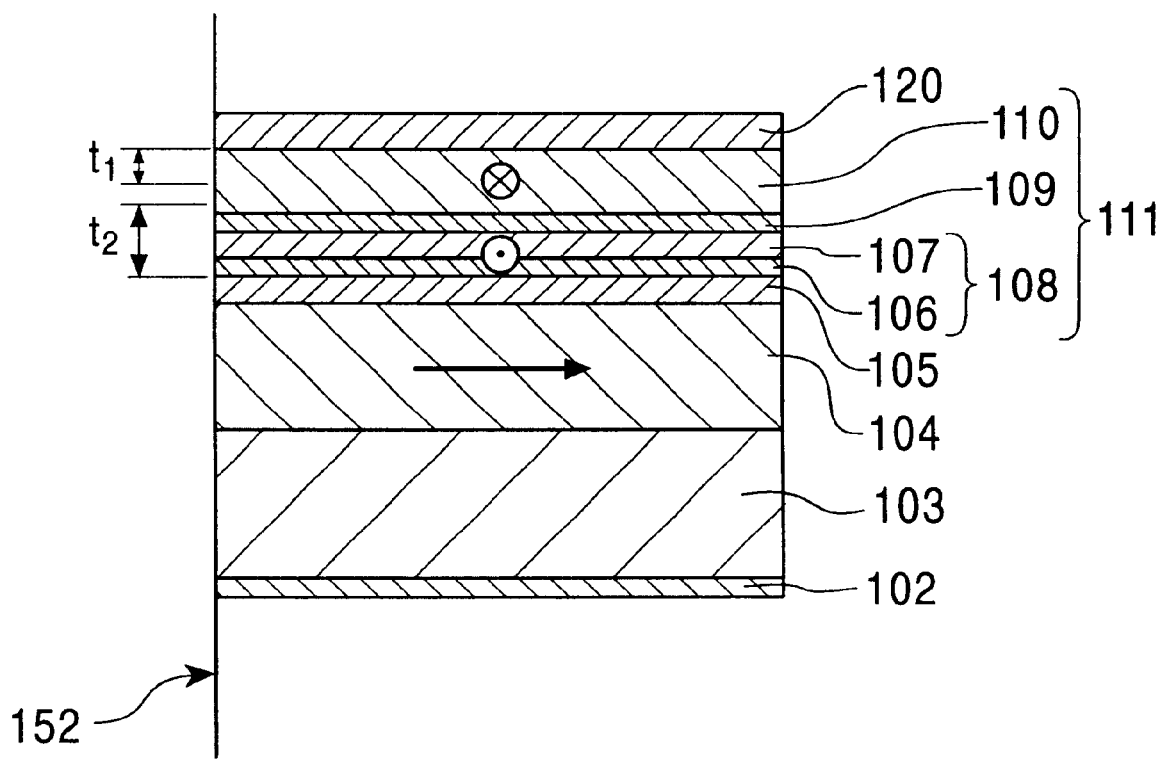
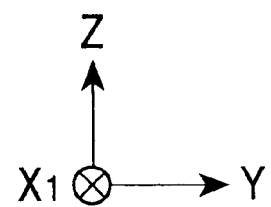

SPIN VALVE THIN FILM MAGNETIC ELEMENT AND THIN FILM MAGNETIC HEAD

BACKGROUND OF THE INVENTION

1. Field of the Invention

The present invention relates to spin valve thin film magnetic elements and thin film magnetic heads. In particular, the present invention relates to spin valve thin film magnetic elements in which shunt losses of sensing currents are reduced and rates of change in magnetoresistance are increased.

2. Description of the Related Art

Among magnetoresistive effect type magnetic heads, there are MR (Magnetoresistive) heads, providing an element showing a magnetoresistive effect, and GMR (Giant Magnetoresistive) heads, providing an element showing a giant magnetoresistive effect. In the MR head, the element showing a magnetoresistive effect is made to have a single-layer structure made of magnetic materials. On the other hand, in the GMR head, the element showing a magnetoresistive effect is made to have a multi-layer structure composed of laminated plural materials. There are several kinds of structures generating giant magnetoresistive effects, and the spin valve thin film magnetic element is the one having a relatively simple structure, and having a high rate of change in resistance to an external magnetic field.

Recently, requirements for further increase in the magnetic recording density have been even more intensified, and the spin valve thin film magnetic elements, which have the potential to fulfill further demands for increases in magnetic recording density, have attracted great amounts of attention.

Next, a conventional spin valve thin film magnetic element is explained referring to the drawings. FIG. 15 is a schematic sectional view of a conventional spin valve thin film magnetic element 101 viewed from a magnetic recording medium side. FIG. 16 is a schematic sectional view of the spin valve thin film magnetic element 101 viewed from a track width direction.

On the top and bottom of the spin valve thin film magnetic element 101, shield layers are formed via gap layers, and a reproducing thin film magnetic head is composed of the spin valve thin film magnetic element 101, gap layers, and shield layers. A recording inductive head may be laminated on said thin film magnetic head.

The thin film magnetic head is provided on an end portion of a trailing side of a floating slider, etc., together with an inductive head, to constitute a thin film magnetic head, and to detect recording magnetic fields of magnetic recording media such as hard disks.

In FIGS. 15 and 16, the Z direction shown in the drawings is a moving direction of the magnetic recording medium, the Y direction shown in the drawings is a direction of a leakage magnetic field from the magnetic recording medium, and the $X_1$ direction shown in the drawings is a direction of the track width of the spin valve thin film magnetic element 101.

The spin valve thin film magnetic element 101, shown in FIG. 15 and FIG. 16, is a bottom type single spin valve thin film magnetic element constituted by orderly laminating an antiferromagnetic layer 103, a pinned magnetic layer 104, a nonmagnetic conductive layer 105, and a free magnetic layer 111.

In FIG. 15 and FIG. 16, the numeral 100 shows an insulating layer formed from $Al_2O_3$, etc., and the numeral 102 shows a substrate layer made of Ta, etc., laminated on the insulating layer 100. The antiferromagnetic layer 103, the pinned magnetic layer 104, the nonmagnetic conductive layer 105 formed from Cu, etc., and the free magnetic layer 111 are laminated in order on the substrate layer 102, and a cap layer 120 formed from Ta, etc., is laminated on the free magnetic layer 111.

Thus, each layer from the substrate layer 102 to the cap layer 120 is laminated in order to constitute a laminate 121 having a width meeting the track width, and having a sectional view of nearly trapezoidal shape.

The pinned magnetic layer 104 formed from, for example, Co, is laminated in contact with the antiferromagnetic layer 103, and an exchange coupling magnetic field (an exchange anisotropic magnetic field) is generated on the boundary of the antiferromagnetic layer 103 and the pinned magnetic layer 104; then, the direction of magnetization of the pinned magnetic layer 104 is pinned in the Y direction shown in the drawings.

The free magnetic layer 111 is composed of a nonmagnetic intermediate layer 109, and the first free magnetic layer 110 and the second free magnetic layer 108 holding said nonmagnetic intermediate layer between these. The first free magnetic layer 110 is provided on the cap layer 120 side of the nonmagnetic intermediate layer 109, and the second free magnetic layer 108 is provided on the nonmagnetic conductive layer 105 side of the nonmagnetic intermediate layer 109. The thickness $t_1$ of the first free magnetic layer 110 is slightly greater than the thickness $t_2$ of the second free magnetic layer 108.

The first free magnetic layer 110 is formed from a ferromagnetic material such as a NiFe alloy, and the nonmagnetic intermediate layer 109 is formed from a nonmagnetic material such as Ru.

The second free magnetic layer 108 is composed of a diffusion preventing layer 106 and a ferromagnetic layer 107. The diffusion preventing layer 106 and the ferromagnetic layer 107 are both made of ferromagnetic materials, the diffusion preventing layer 106 is formed from, for example, Co, and the ferromagnetic layer 107 is formed from the NiFe alloy. The first free magnetic layer 110 and the ferromagnetic layer 107 are preferably composed of the same material.

The diffusion preventing layer 106 is provided to prevent the mutual diffusion of the ferromagnetic layer 107 and the nonmagnetic conductive layer 105, and to increase the GMR effect (ΔMR) generated at the interface of the nonmagnetic conductive layer 105.

When saturation magnetizations of the first free magnetic layer 110 and the second free magnetic layer 108 are shown by $M_1$ and $M_2$, respectively, the magnetic film thickness of the first free magnetic layer 110 and the second free magnetic layer 108 become $M_1 \cdot t_1$ and $M_2 \cdot t_2$, respectively.

Then, the free magnetic layer 111 is constituted so that the magnetic film thickness of the first free magnetic layer 110 and the magnetic film thickness of the second free magnetic layer 108 are made to meet the relation $M_1 \cdot t_1 > M_2 \cdot t_2$.

The first free magnetic layer 110 and the second free magnetic layer 108 are antiferromagnetically coupled to each other. That is, when the direction of magnetization of the first free magnetic layer 110 is oriented in the $X_1$ direction shown in the drawings by bias layers 132 and 132, the direction of magnetization of the second free magnetic layer 108 is oriented in the direction opposite to the $X_1$ direction.

The relationship of the magnetic film thickness of the first free magnetic layer 110 and the magnetic film thickness of the second free magnetic layer 108 is specified as being $M_1 \cdot t_1 > M_2 \cdot t_2$, to create a state in which the magnetization of the first free magnetic layer 110 remains, and to orient the direction of magnetization of the free magnetic layer 111, as a whole, in the $X_1$ direction shown in the drawings. At this time, a magnetic effective film thickness of the free magnetic layer 111 becomes $(M_1 \cdot t_1 - M_2 \cdot t_2)$.

Thus, because the first free magnetic layer 110 and the second free magnetic layer 108 are antiferromagnetically coupled to make each direction of magnetization antiparallel, and the relation of each magnetic film thickness is specified as being $M_1 \cdot t_1 > M_2 \cdot t_2$, these are made to become the artificial ferrimagnetic state (synthetic ferrimagnetic state).

Therefore, the direction of magnetization of said free magnetic layer 111 and the direction of magnetization of said pinned magnetic layer 104 are cross each other.

The bias layers 132 and 132 are formed on both sides of the laminate 121. These bias layers 132 and 132 orient the direction of magnetization of the first free magnetic layer 110 in the $X_1$ direction shown in the drawings, to make the free magnetic layer 111 a single domain, and to suppress the Barkhausen noise of the free magnetic layer 111.

The numerals 134 and 134 show conductive layers formed from Cu, etc. Said conductive layers 134 and 134 apply a sensing current (a detection current) to the laminate 121.

A bias substrate 131 made of, for example, Cr, is provided between the bias layer 132 and the insulating layer 100, and between the bias layer 132 and the laminate 121, and an intermediate layer 133 made of, for example, Ta or Cr, is provided between the bias layer 132 and the conductive layer 134.

In the spin valve thin film magnetic element 101, when the direction of magnetization of the free magnetic layer 111, oriented in the $X_1$ direction shown in the drawings, is changed due to a leakage magnetic field from a recording medium such as a hard disk, the electrical resistance is changed in connection with the magnetization of the pinned magnetic layer 104, pinned in the Y direction shown in the drawings, and, then, the leakage magnetic field from the recording medium is detected based on the change in voltage due to the change in the electrical resistance value.

Because the free magnetic layer 111 is composed of the first and second free magnetic layers 110 and 108, being antiferromagnetically coupled to each other, the direction of magnetization of the free magnetic layer 111, as a whole, changes due to a small amount of external magnetic field to increase the sensitivity of the spin valve thin film magnetic element 101.

In particular, it becomes possible to decrease the effective film thickness $(M_1 \cdot t_1 - M_2 \cdot t_2)$ of the free magnetic layer 111 by properly adjusting the film thickness, etc., of the first and second free magnetic layers 110 and 108, and, therefore, the direction of magnetization of the free magnetic layer changes easily due to a small amount of external magnetic field to increase the sensitivity of the spin valve thin film magnetic element 101.

In the conventional spin valve thin film magnetic element 101, there have been problems in that because the free magnetic layer 111 has a lamination structure of three layers composed of the first and second free magnetic layers 110 and 108, and the nonmagnetic intermediate layer 109, the laminate 121 itself is made thick, the shunt loss occurs due to a reduction of conduction of electrons flowing through the nonmagnetic intermediate layer 105 by the generation of a shunt of the sensing current, and the rate of change in magnetoresistance of the spin valve thin film magnetic element is reduced.

SUMMARY OF THE INVENTION

The present invention is was made taking the aforementioned circumstances into consideration. It is an object of the present invention to provide spin valve thin film magnetic elements in which the detection sensitivity of external magnetic fields is increased, the shunt loss of the sensing current is reduced, and the rate of change in magnetoresistance is increased. It is another object of the present invention to provide thin film magnetic heads comprising the spin valve thin film magnetic elements.

To achieve the aforementioned objects, the following constitution is adopted in the present invention.

A spin valve thin film magnetic element of the present invention comprises an antiferromagnetic layer; a pinned magnetic layer formed in contact with said antiferromagnetic layer, in which the direction of the magnetization is pinned by an exchange coupling magnetic field with said antiferromagnetic layer; a nonmagnetic conductive layer in contact with said pinned magnetic layer; and a free magnetic layer in contact with said nonmagnetic conductive layer, in which said free magnetic layer is composed of a nonmagnetic intermediate layer, and first and second free magnetic layers holding said nonmagnetic intermediate layer therebetween; said first free magnetic layer and said second free magnetic layer are antiferromagnetically coupled so as to be in a ferrimagnetic state; and a resistivity of said first free magnetic layer, in the far side from said nonmagnetic intermediate layer, is higher than a resistivity of said second free magnetic layer, in said nonmagnetic intermediate layer side.

According to said spin valve thin film magnetic element, because the resistivity of the first free magnetic layer, constituting the free magnetic layer, is higher than the resistivity of the second free magnetic layer, a detection current is difficult to flow through the first free magnetic layer, and, therefore, the shunt of the detection current is suppressed, the shunt loss is reduced, and the rate of change in magnetoresistance of the spin valve thin film magnetic element may be increased.

Research was performed, regarding the conventional spin valve thin film magnetic element 101 as a base constitution, to determine the degree of the effect which could be specifically anticipated when the shunt of the sensing current was suppressed.

In the conventional spin valve thin film magnetic element 101, when the first free magnetic layer is made of 3 nm NiFe alloy, the rate of change in magnetoresistance is 7.3%; however, when the first free magnetic layer and the nonmagnetic intermediate layer are removed from the constitution of the conventional spin valve thin film magnetic element, to reduce the shunt of the sensing current, the rate of change in magnetoresistance becomes 8.0%, which is an increase of about 10%. Thus, by suppressing the shunt of the sensing current, a large increase in the rate of change in magnetoresistance can be expected.

However, in the constitution wherein the first free magnetic layer and the nonmagnetic intermediate layer are removed from the constitution of the conventional spin valve thin film magnetic element, as the free magnetic layer does not enter the ferrimagnetic state, the detection sensitivity for the external magnetic field is remarkably reduced.

Therefore, according to the present invention, a novel particular effect can be obtained, wherein the rate of change in magnetoresistance can be increased, while maintaining the detection sensitivity for external magnetic fields.

The spin valve thin film magnetic element of the present invention may be the aforementioned spin valve thin film magnetic element, wherein the aforementioned first free magnetic layer is composed of the first ferromagnetic layer in contact with the aforementioned nonmagnetic intermediate layer, and the second ferromagnetic layer in contact with said first ferromagnetic layer; said first ferromagnetic layer is antiferromagnetically coupled to the aforementioned second free magnetic layer holding the said nonmagnetic intermediate layer therebetween; and a resistivity of said second ferromagnetic layer is higher than a resistivity of said first ferromagnetic layer.

According to such a spin valve thin film magnetic element, because the first ferromagnetic layer, constituting the first free magnetic layer, is antiferromagnetically coupled to the aforementioned second free magnetic layer, and the resistivity of the second ferromagnetic layer is higher than the resistivity of the first ferromagnetic layer, the first free magnetic layer itself can be antiferromagnetically coupled to the second free magnetic layer to enter the ferrimagnetic state, and the shunt loss of the detection current can be reduced by increasing the resistivity of the first free magnetic layer, as a whole.

The aforementioned first free magnetic layer is preferably made of either a NiFeX alloy, where X is one or more elements selected from the group consisting of Cr, V, Nb, Hf, Ta, Mo, and W, or a CoMT alloy, where M is one of Zr and Hf, or both, and T is one of Nb and Ta, or both.

The aforementioned first ferromagnetic layer may be made of a NiFe alloy, and the aforementioned second ferromagnetic layer may be made of either a NiFeX alloy, where X is one or more elements selected from the group consisting of Cr, V, Nb, Hf, Ta, Mo, and W, or a CoMT alloy, where M is one of Zr and Hf, or both, and T is one of Nb and Ta, or both.

The spin valve thin film magnetic element of the present invention is the aforementioned spin valve thin film magnetic element, wherein said thin film magnetic element may be constituted so that a part adjacent to the aforementioned nonmagnetic intermediate layer, of the aforementioned first free magnetic layer, is made of a NiFe alloy phase; and a part in the far side from said nonmagnetic intermediate layer is made of either a NiFeX alloy phase, where X is one or more elements selected from the group consisting of Cr, V, Nb, Hf, Ta, Mo, and W, or a CoMT alloy phase, where M is one of Zr and Hf, or both, and T is one of Nb and Ta, or both; and a composition of a part held between said NiFe alloy phase, and said NiFeX alloy phase or CoMT alloy phase, is gradually changed from the NiFe alloy phase to the NiFeX alloy phase or CoMT alloy phase, as the distance from said nonmagnetic intermediate layer is increased.

The spin valve thin film magnetic element of the present invention is the aforementioned spin valve thin film magnetic element, wherein the aforementioned NiFeX alloy is preferably represented by the formula $Ni_aFe_bX_c$, where X is one or more elements selected from the group consisting of Cr, V, Nb, Hf, Ta, Mo, and W, and a, b, and c are compositions being within the ranges 60 atom $\% \leq a \leq 90$ atom %, 5 atom $\% \leq b \leq 30$ atom %, and 0 atom $\% < c \leq 15$ atom %.

The spin valve thin film magnetic element of the present invention is the aforementioned spin valve thin film magnetic element, wherein the aforementioned CoMT alloy is preferably made of a constitution comprising an amorphous phase as a primary phase, and is preferably represented by the formula $Co_dM_eT_f$, where M is one of Zr and Hf, or both, and T is one of Nb and Ta, or both, and d, e, and f are compositions being within the ranges 78 atom $\% \leq d \leq 92$ atom %, e=g(100-d) atom %, f=(100-d-e) atom %, and said g is within the range $0.1 \leq g \leq 0.5$.

The spin valve thin film magnetic element of the present invention is the aforementioned spin valve thin film magnetic element, wherein the aforementioned thickness s of the first ferromagnetic layer is preferably within the range 0 nm<s$\leq$1 nm.

When the thickness s of the first ferromagnetic layer is 0 nm, i.e., the first ferromagnetic layer, made of the NiFe alloy, is not provided, the second ferromagnetic layer, made of the NiFeX alloy or the CoMT alloy, comes into contact with the nonmagnetic intermediate layer, and this is not preferable because these alloys are inferior in magnetic properties compared to the NiFe alloy, these cannot be antiferromagnetically coupled easily to the second free magnetic layer, and cannot make the free magnetic layer enter the ferrimagnetic state.

When the thickness s of the first ferromagnetic layer is more than 1 nm, this is not preferable because the film thickness of the free magnetic layer itself is increased to easily generate the shunt of the detection current.

The aforementioned second free magnetic layer is preferably composed of a single-layer film made of one selected from the group consisting of Co, a CoFe alloy, a NiFe alloy, a CoNi alloy, and a CoNiFe alloy, or is preferably composed of a multi-layer film in which two or more kinds of said single-layer films are laminated.

The aforementioned antiferromagnetic layer is preferably made of either an alloy represented by the formula X—Mn, where X is an element selected from the group consisting of Pt, Pd, Ru, Ir, Rh, and Os, or an alloy represented by the formula X'—Pt—Mn, where X' is one or more elements selected from the group consisting of Pd, Cr, Ni, Ru, Ir, Rh, Os, Au, and Ag.

The aforementioned pinned magnetic layer is preferably composed of a nonmagnetic layer, and the first and the second pinned magnetic layers holding said nonmagnetic layer therebetween, the directions of magnetization of said first and second pinned magnetic layers are preferably made antiparallel, and said first and second pinned magnetic layers are preferably made to enter the ferrimagnetic state.

A thin film magnetic head of the present invention provides the aforementioned spin valve thin film magnetic element.

BRIEF DESCRIPTION OF THE DRAWINGS

FIG. 16 is a schematic sectional view of a conventional spin valve thin film magnetic element viewed from a track width direction.

DESCRIPTION OF THE PREFERRED EMBODIMENTS

The present invention will be explained using the following embodiments with reference to the drawings.

First Embodiment

Figure 1:
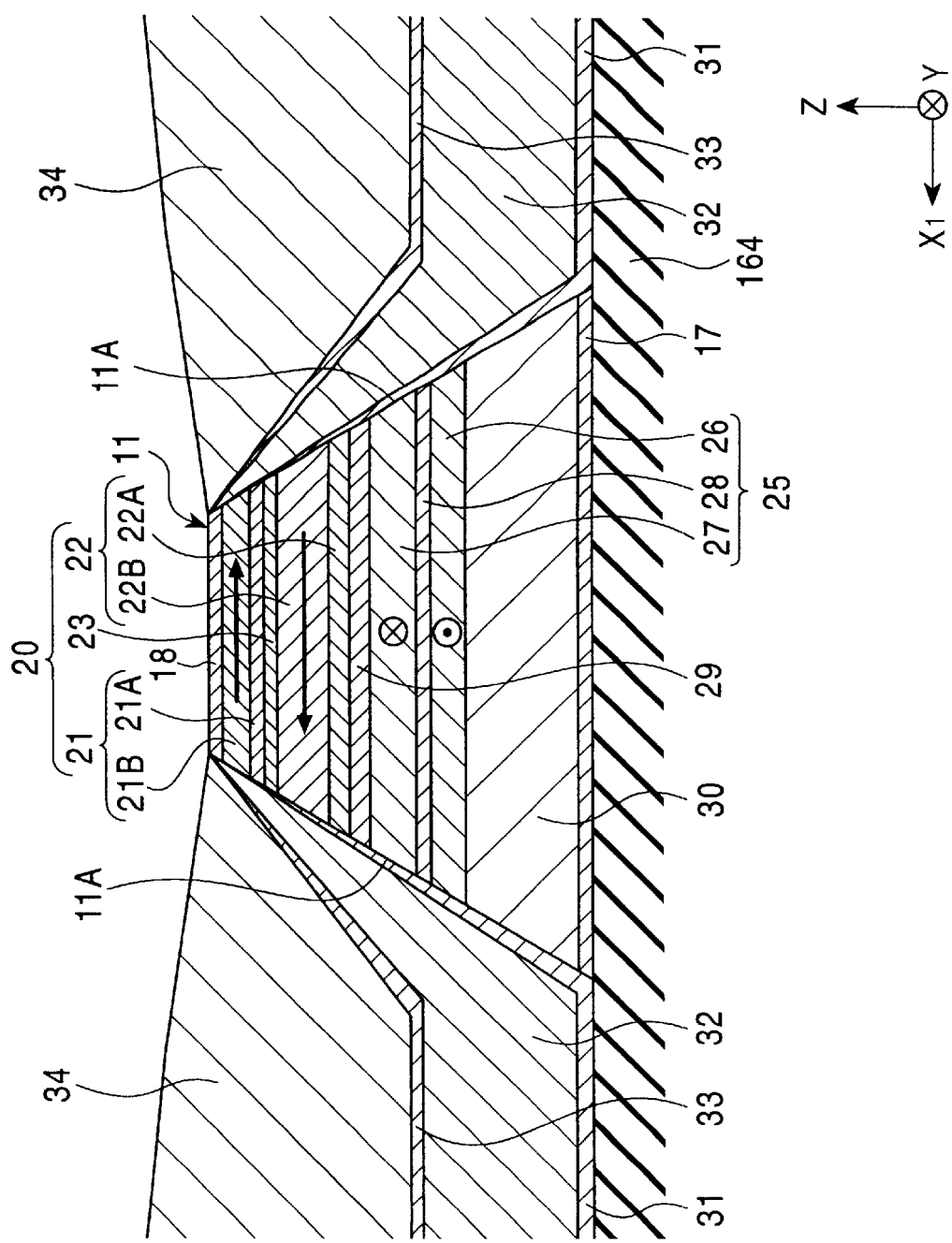
FIG. 1 is a schematic sectional view of a spin valve thin film magnetic element according to the first embodiment of the present invention viewed from a magnetic recording medium side.
Figure 2:
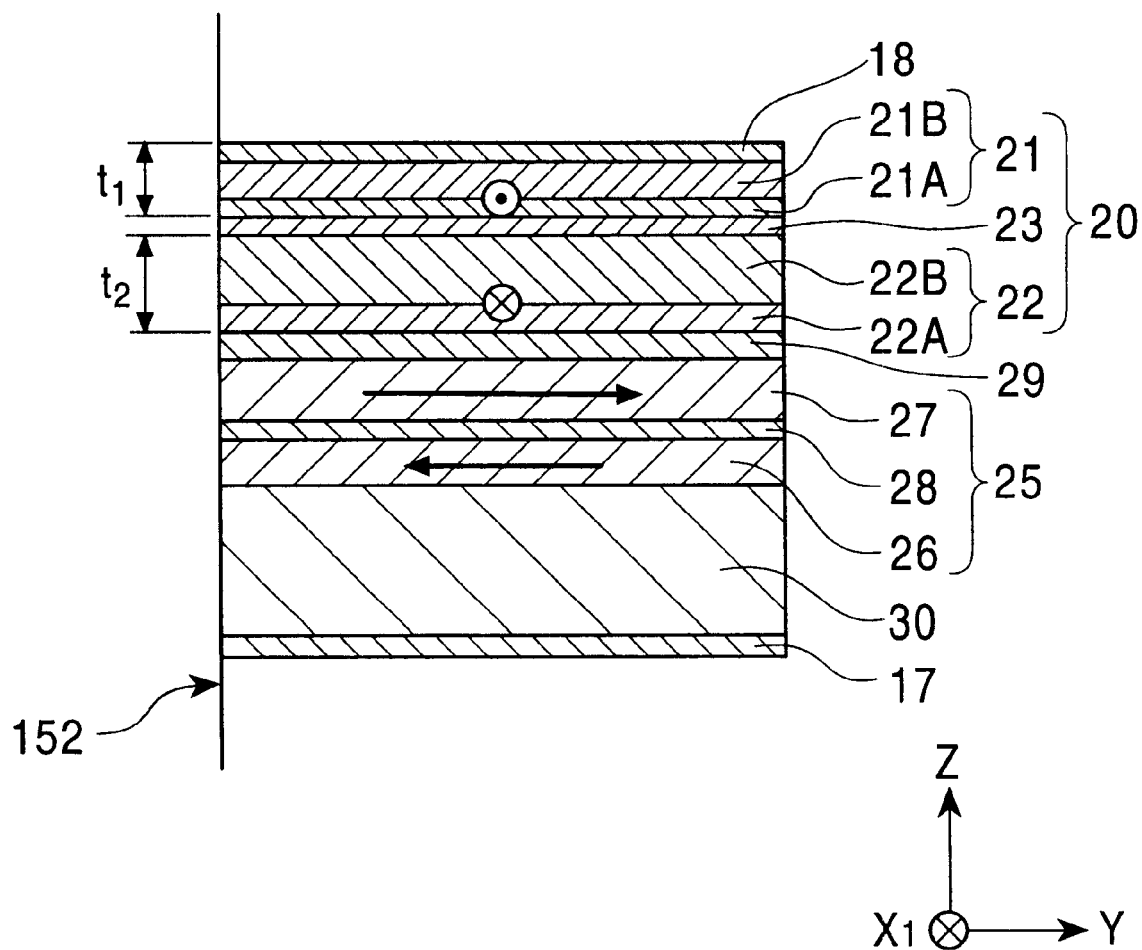
FIG. 2 is a schematic sectional view of the spin valve thin film magnetic element shown in FIG. 1 viewed from a track width direction.

FIG. 1 is a schematic sectional view of a spin valve thin film magnetic element 1 according to the first embodiment of the present invention viewed from a magnetic recording medium side, and FIG. 2 is a schematic sectional view of the spin valve thin film magnetic element 1 viewed from a track width direction.

Figure 3:
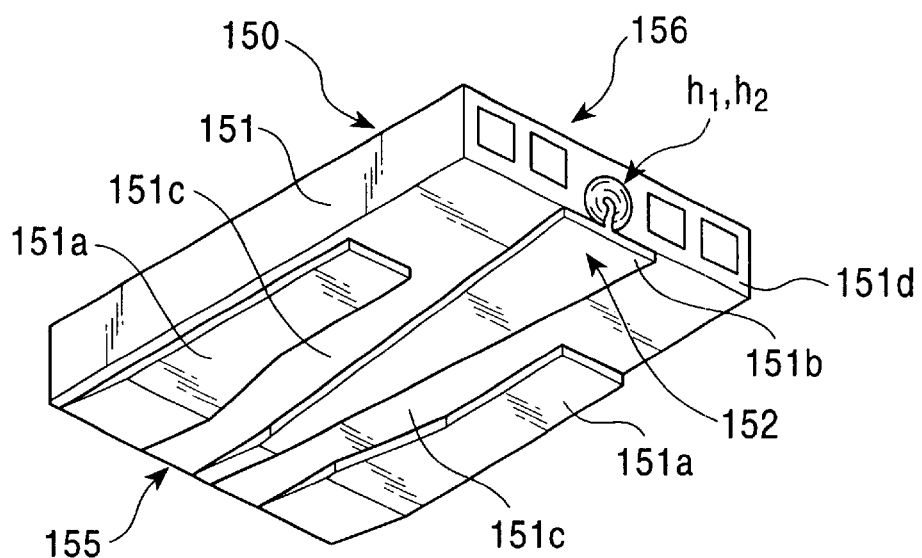
FIG. 3 is a perspective view of a floating magnetic head providing a thin film magnetic head according to an embodiment of the present invention.
Figure 4:
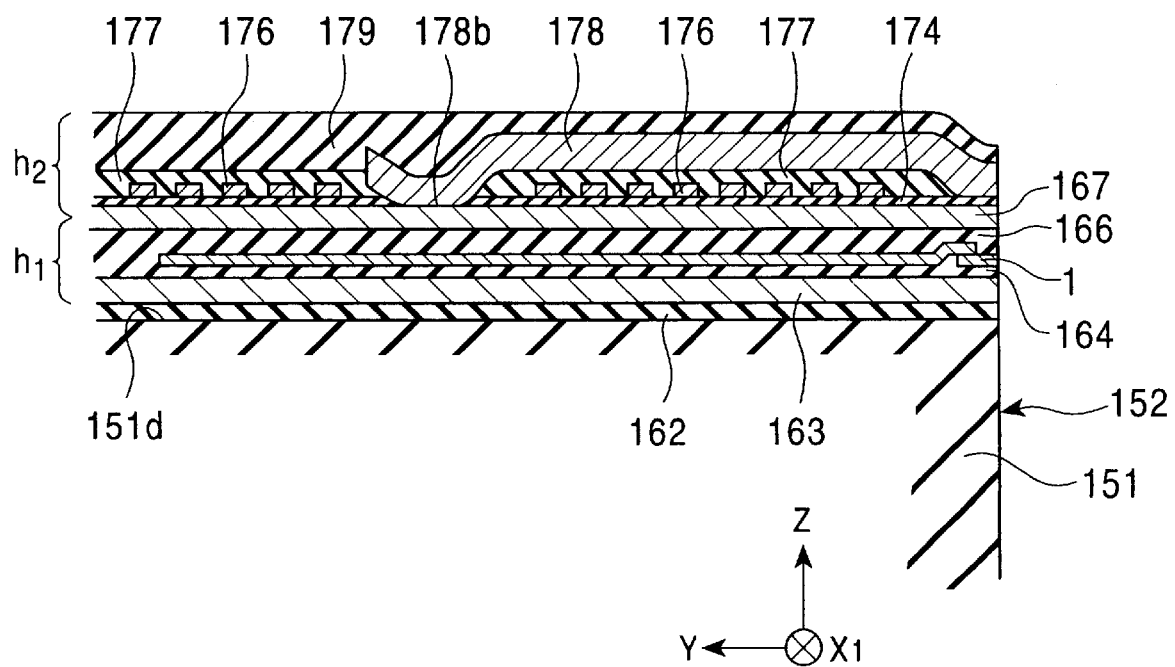
FIG. 4 is a schematic sectional view of a primary part of the floating magnetic head shown in FIG. 3.

FIG. 3 and FIG. 4 show a floating magnetic head 150 composed of a thin film magnetic head providing the spin valve thin film magnetic element 1.

The floating magnetic head 150, shown in FIG. 3, is primarily composed of a slider 151, a thin film magnetic head $h_1$ according to the present invention, provided on an end face 151d of the slider 151, and an inductive head $h_2$. The reference numeral 155 indicates a leading side, which is the upstream side of the movement direction of the magnetic recording medium of the slider 151, and the reference numeral 156 indicates a trailing side. Rails 151a, 151a, and 151b are formed on a medium counter face 152 of the slider 151, and there are air grooves 151c and 151c between each rail.

As shown in FIG. 3 and FIG. 4, the thin film magnetic head $h_1$ according to the present invention is composed of an insulating layer 162 formed on the end face 151d of the slider 151, a lower shield layer 163 laminated on the insulating layer 162, a lower gap layer 164 laminated on the lower shield layer 163, the spin valve thin film magnetic element 1 according to the present invention, formed on the lower gap layer 164 and being exposed to the medium counter face 152, an upper gap layer 166 covering the spin valve thin film magnetic element 1, and an upper shield layer 167 covering the upper gap layer 166.

The upper shield layer 167 is also used as a lower core layer of an inductive head $h_2$ mentioned below.

The inductive head $h_2$ is composed of the lower core layer (the upper shield layer) 167, a gap layer 174 laminated on the lower core layer 167, a coil 176, an upper insulating layer 177 covering the coil 176, and an upper core layer 178, joined with the gap layer 174, and joined with the lower core layer 167 on the coil 176 side.

The coil 176 is patterned to be planar and spiral. A tip part 178b of the upper core layer 178 is magnetically connected to the lower core layer 167, at about the central part of the coil 176.

A core protective layer 179 made of alumina, etc., is laminated on the upper core layer 178.

In FIG. 1, FIG. 2, and FIG. 4, the Z direction shown in the drawings is the direction of movement of the magnetic recording medium, the Y direction shown in the drawings is the direction of leakage magnetic field from the magnetic recording medium, and the X direction shown in the drawings is the track width direction of the spin valve thin film magnetic element 1.

The spin valve thin film magnetic element 1, shown in FIG. 1 and FIG. 2, is a bottom type single spin valve thin film magnetic element constituted by orderly laminating an antiferromagnetic layer 30, a pinned magnetic layer 25, a nonmagnetic conductive layer 29, and a free magnetic layer 20.

In FIG. 1 and FIG. 2, the numeral 164 shows a lower gap layer formed from $Al_2O_3$, etc., and the numeral 17 shows a substrate layer made of Ta (tantalum), etc., and is laminated on the lower gap layer 164. The antiferromagnetic layer 30 is laminated on the substrate layer 17, the pinned magnetic layer 25 is laminated on the antiferromagnetic layer 30, the nonmagnetic conductive layer 29 formed from Cu, etc., is laminated on the pinned magnetic layer 25, the free magnetic layer 20 is laminated on the nonmagnetic conductive layer 29, and a cap layer 18 formed from Ta, etc., is laminated on the free magnetic layer 20.

Thus, each layer from the substrate layer 17 to the cap layer 18 is orderly laminated to constitute a laminate 11, having a width matching the track width, and having a nearly trapezoidal shape in sectional view.

The free magnetic layer 20 is composed of a nonmagnetic intermediate layer 23, and the first free magnetic layer 21 and the second free magnetic layer 22, holding the nonmagnetic intermediate layer 23 therebetween, and being antiferromagnetically coupled to enter the ferrimagnetic state, and is oriented in the direction of magnetization in the $X_1$ direction shown in the drawings.

The pinned magnetic layer 25 is composed of a nonmagnetic layer 28, and the first pinned magnetic layer 26 and the second pinned magnetic layer 27 holding the nonmagnetic layer 28 therebetween, and is pinned the direction of magnetization in the Y direction shown in the drawings.

The spin valve thin film magnetic element 1 shows a giant magnetoresistive effect, in which, when the direction of magnetization of the free magnetic layer 20, oriented in the $X_1$ direction shown in the drawings, is changed due to a leakage magnetic field from a recording medium such as a hard disk, the electrical resistance is changed in connection with the magnetization of the pinned magnetic layer 25, pinned in the Y direction, and then the leakage magnetic field from a recording medium is detected based on the change in the voltage due to the change in the electrical resistance value.

A pair of bias layers 32 and 32 made of, for example, a Co—Pt (cobalt-platinum) alloy, are formed on both sides of the laminate 11 in the $X_1$ direction shown in the drawings, i.e., on both sides in the track width direction. The bias layers 32 and 32 are formed going aground on both sides 11A and 11A of the laminate 11 from the upper side of the lower gap layer 164. The bias layers 32 and 32 orient the direction of magnetization of the free magnetic layer 20 to reduce the Barkhausen noise of the free magnetic layer 20.

Conductive layers, indicated by the reference numerals 34 and 34, are laminated above the bias layers 32 and 32. The conductive layers 34 and 34 apply a sensing current (a detection current) to the laminate 11.

Bias substrates 31 made of, for example, nonmagnetic metal Cr, are provided between the bias layers 32 and 32, and the lower gap layer 164, and between the bias layers 32 and 32, and the laminate 11.

By forming the bias layers 32 on the bias substrates 31 made of Cr having a crystal structure of body-centered cubic structure (bcc structure), the coercive force and the rectangularity ratio of the bias layers 32 are increased, and the bias magnetic field, required for making the second free magnetic layer 22 form a single magnetic domain, may be increased.

Furthermore, intermediate layers 33 and 33 made from, for example, nonmagnetic metal Ta or Cr, are provided between the bias layers 32 and 32, and the conductive layers 34 and 34.

When Cr is used as the conductive layers 34 and 34, by providing the intermediate layers 33 and 33 made of Ta to function as diffusion barriers during the subsequent thermal processing such as resist hardening, the degradation of magnetic properties of the bias layers 32 and 32 can be prevented. When Ta is used as the conductive layers 34 and 34, by providing the intermediate layers 33 and 33 made of Cr, there is an effect that crystals of Ta, deposited on Cr, is likely to form the lower resistance body-centered cubic structure.

As shown in FIG. 1 and FIG. 2, the free magnetic layer 20 is composed of a nonmagnetic intermediate layer 23, and the first free magnetic layer 21 and the second free magnetic layer 22 holding the nonmagnetic intermediate layer 23 therebetween.

The first free magnetic layer 21 is provided in the side farther from the nonmagnetic conductive layer 29 than is the nonmagnetic intermediate layer 23, and is in contact with the cap layer 18. On the other hand, the second free magnetic layer 22 is provided in the side nearer to the nonmagnetic conductive layer 29 than is the nonmagnetic intermediate layer 23, and is in contact with the nonmagnetic conductive layer 29.

It is constituted so that the resistivity of the first free magnetic layer 21 is higher than the resistivity of the second free magnetic layer 22. That is, materials constituting the first and second free magnetic layers 21 and 22 are properly selected so that the material of the first free magnetic layer 21 has a higher resistance than the material of the second free magnetic layer 22.

The thickness $t_2$ of the second free magnetic layer 22 is greater than the thickness $t_1$ of the first free magnetic layer 21.

The first free magnetic layer 21 is composed of the first ferromagnetic layer 21A in contact with the nonmagnetic intermediate layer 23, and the second ferromagnetic layer 21B laminated on the first ferromagnetic layer 21A, and is in contact with the cap layer 18. The second ferromagnetic layer 21B is made to have a higher resistivity than the first ferromagnetic layer 21A. That is, materials of the first and second ferromagnetic layers 21A and 21B are properly selected so that the material of the second ferromagnetic layer 21B has a higher resistance than the material of the first ferromagnetic layer 21A.

The thickness s of the first ferromagnetic layer 21A is preferably within the range 0 nm<s≦1 nm.

The thickness $t_1$ of the first free magnetic layer 21, as a whole, is preferably within the range 0.5 to 3 nm.

The first ferromagnetic layer 21A is preferably composed of a NiFe alloy.

The second ferromagnetic layer 21B is preferably composed of a NiFeX alloy or a CoMT alloy having a higher resistivity than the NiFe alloy, where the element X is one or more elements selected from the group consisting of Cr, V, Nb, Hf, Ta, Mo, and W, the element M is one of Zr and Hf, or both, and the element T is one of Nb and Ta, or both.

The nonmagnetic intermediate layer 23 is formed from a nonmagnetic material, and is preferably formed from one selected from the group consisting of Ru, Rh, Ir, Cr, Re, and Cu, or an alloy thereof, and in particular, is preferably formed from Ru.

The second free magnetic layer 22 is composed of a diffusion preventing layer 22A and the third ferromagnetic layer 22B. The diffusion preventing layer 22A is made of a ferromagnetic material, and is formed from, for example, Co. The diffusion preventing layer 22A prevents the mutual diffusion of the third ferromagnetic layer 22B and the nonmagnetic conductive layer 29.

The third ferromagnetic layer 22B is made of a ferromagnetic material, and is formed, for example, from one selected from the group consisting of Co, a CoFe alloy, a NiFe alloy, a CoNi alloy, and a CoNiFe alloy. In particular, it is preferably formed from a NiFe alloy.

The second free magnetic layer 22 may be composed of a single layer, and in such a case, the second free magnetic layer is preferably composed of one selected from the group consisting of Co, the CoFe alloy, the NiFe alloy, the CoNi alloy, and the CoNiFe alloy.

The thickness $t_2$ of the second free magnetic layer 22 is preferably within the range 1.5 to 4.5 nm.

The NiFeX alloy and the CoMT alloy, constituting the second ferromagnetic layer 21B in the first free magnetic layer 21, have a higher resistivity than the NiFe alloy, constituting the first ferromagnetic layer 21A, and Co, the CoFe alloy, the NiFe alloy, the CoNi alloy, and the CoNiFe alloy, constituting the second free magnetic layer 22 (the diffusion preventing layer 22A and the third ferromagnetic layer 22B).

Therefore, when the second ferromagnetic layer 21B is composed of the NiFeX alloy or the CoMT alloy, the resistivity of the first free magnetic layer 21, as a whole, becomes higher than the resistivity of the second free magnetic layer 22, and the sensing current becomes difficult to flow through the first free magnetic layer 21.

Therefore, the sensing current, flowing through the laminate 11, flows primarily through the nonmagnetic conductive layer 29, the pinned magnetic layer 25, and the second free magnetic layer 22 to suppress the shunt of the sensing current.

The giant magnetoresistive effect of the spin valve thin film magnetic element 1 is generated primarily at the boundaries of the nonmagnetic conductive layer 29, and the second free magnetic layer 22 and the pinned magnetic layer 25. That is, when a sensing current is applied to the laminate 11 while the direction of magnetization of the free magnetic layer 20 is changing due to an external magnetic field, conducted electrons, moving through the nonmagnetic conductive layer 29, are scattered at the boundaries of the nonmagnetic conductive layer 29, and the free magnetic layer 20 and the pinned magnetic layer 25. As the scattering of the conduction electrons is changed due to the direction of magnetization of the free magnetic layer 20, the mean free path of the conducted electrons is altered to change the rate of change in magnetoresistance.

Therefore, by constituting the first free magnetic layer 21 of high resistivity materials, and constituting it so that the sensing current flows in the periphery of the nonmagnetic conductive layer 29, the conducted electrons, contributing to the giant magnetoresistive effect, may be increased and the rate of change in magnetoresistance may be increased.

The thickness $t_2$ of the second free magnetic layer 22 is preferably formed to be greater than the thickness $t_1$ of the first free magnetic layer 21.

In particular, when the saturation magnetization of the first free magnetic layer 21 and the second free magnetic layer 22 are indicated by $M_1$ and $M_2$, respectively, and the magnetic film thickness of the first free magnetic layer 21 and the second free magnetic layer 22 are indicated by $M_1 \cdot t_1$ and $M_2 \cdot t_2$, respectively, it is more preferably constituted so that the magnetic film thickness of the first free magnetic layer 21 and the magnetic film thickness of the second free magnetic layer 22 are made to fulfill the relation $M_2 \cdot t_2 > M_1 \cdot t_1$.

Thus, when the thickness or magnetic film thickness of the second free magnetic layer 22 is greater than the thickness or magnetic film thickness of the first free magnetic layer 21, and the first free magnetic layer 21 and the second free magnetic layer 22 are antiferromagnetically coupled, it enters a state in which the magnetization of the second free magnetic layer 22 remains.

That is, as shown in FIG. 1 and FIG. 2, when the direction of magnetization of the second free magnetic layer 22 is oriented in the $X_1$ direction shown in the drawings by the bias layers 32 and 32, the direction of magnetization of the first free magnetic layer 21 is oriented in the direction opposite to the $X_1$ direction.

For example, when the magnetic film thickness of the first and second free magnetic layers 21 and 22 are made to fulfill the relation $M_2 \cdot t_2 > M_1 \cdot t_1$, it enters a state in which the magnetization of the second free magnetic layer 22 remains, and the direction of magnetization of the free magnetic layer 20, as a whole, is oriented in the $X_1$ direction shown in the drawings.

Thus, the first free magnetic layer 21 and the second free magnetic layer 22 are antiferromagnetically coupled to make each direction of magnetization antiparallel, and the relation of the magnetic film thickness is made to be $M_2 \cdot t_2 > M_1 \cdot t_1$, and it enters the artificial ferrimagnetic state (synthetic ferrimagnetic state).

The free magnetic layer 20, thus made to enter the artificial ferrimagnetic state, can be turned in its direction of magnetization, even by a very weak external magnetic field, in accordance with the direction of the external magnetic field.

By making the magnetic film thickness of the first free magnetic layer 21 and the second free magnetic layer 22 fulfill the relation $M_2 \cdot t_2 > M_1 \cdot t_1$, the spin flop magnetic field of the free magnetic layer 20 can be increased; then, the range of the magnetic field, where the free magnetic layer 20 can maintain the ferrimagnetic state, becomes wide, and the free magnetic layer 20 can stably maintain the ferrimagnetic state.

The spin flop magnetic field means the magnitude of the external magnetic field, wherein when the external magnetic field, having said magnitude or more, is applied to two magnetic layers having antiparallel directions of magnetization, the directions of magnetization of the two magnetic layers cannot be maintained antiparallel. Therefore, when the spin flop magnetic field of the free magnetic layer 20 is increased, the ferrimagnetic state is more stably maintained in external magnetic fields.

The first ferromagnetic layer 21A made of the NiFe alloy has a higher saturation magnetic flux density than the second ferromagnetic layer made of the NiFeX alloy or the CoMT alloy, and as Ni and Fe are ferromagnetic elements, is likely to be antiferromagnetically coupled to the second free magnetic layer 22, and it is possible to make the first free magnetic layer 21 and the second free magnetic layer 22 enter the ferrimagnetic state.

The NiFeX alloys are represented by the formula $Ni_aFe_bX_c$, where X is one or more elements selected from the group consisting of Cr, V, Nb, Hf, Ta, Mo, and W, and a, b, and c are compositions being preferably within the ranges 60 atom %$\leq a \leq$90 atom %, 5 atom %$\leq b \leq$30 atom %, and 0 atom %$<c \leq$15 atom %. The composition c is more preferably within the range 0 atom %$<c \leq$10 atom %.

Ni and Fe impart magnetism to the NiFeX alloys.

It is not preferable that a, showing the composition of Ni, be less than 60 atom %, because soft magnetic properties are degraded, and it is not preferable that a be more than 90 atom %, because the soft magnetic properties are also degraded.

It is not preferable that b, showing the composition of Fe, be less than 5 atom %, because the soft magnetic properties are degraded, and it is not preferable that b be more than 30 atom %, because the soft magnetic properties are also degraded.

The element X has an effect of increasing the resistivity of the NiFeX alloys. It is not preferable that the composition c of the element X be 0 atom %, because the resistivity of the NiFeX alloys cannot be increased, and it is not preferable that the composition c be more than 15 atom %, because the Curie temperature of the NiFeX alloys is room temperature or less, and the NiFeX alloys do not exhibit ferromagnetism at room temperature.

By adjusting the composition c of the element X, the magnetostriction constant of the NiFeX alloys may be 0.

In particular, when the composition c is made to be 10 atom % or less, the resistivity may be increased, and the Curie temperature may be made higher.

For example, the $Ni_{80}Fe_{17}X_3$ alloy has a resistivity of about 30 $\mu\Omega$cm, and the $Ni_{75}Fe_{15}X_{10}$ alloy has a resistivity of about 100 $\mu\Omega$cm.

The resistivity of the NiFe alloy, the composition of which is represented by $Ni_{80}Fe_{20}$, is about 20 $\mu\Omega$cm.

Thus, by the addition of the element X, the resistivity of the NiFeX alloys may be increased.

The CoMT alloys are preferably represented by the formula $CO_dM_eT_f$, where M is one of Zr and Hf, or both, and T is one of Nb and Ta, or both, and d, e, and f are compositions being preferably within the ranges 78 atom %≦d≦92 atom %, e=g(100-d) atom %, f=(100-d-e) atom %, and the aforementioned g is preferably within the range 0.1≦g≦0.5.

Co is an element having magnetism, and its composition d is preferably 78 atom % or more, and 92 atom % or less. When the composition d of Co is within such ranges, the saturation magnetization, the permeability, and the resistivity may be increased, and the magnetostriction constant may be approach 0.

Because the element M has functions of improving corrosion resistance properties, and of increasing the magnetostriction constant, by adjusting the additional amount of the element M, the magnetostriction constant of the CoMT alloy may be adjusted. However, when the composition e of the element M is too high, the saturation magnetization may be lowered. Therefore, the composition e of the element M is preferably 0.1(100-x) atom % or more, and 0.5(100-x) atom % or less.

The addition of the element T has effects such that the amorphous-forming ability of the CoMT alloy may be increased, and the magnetostriction constant is reduced. In particular, it is preferable to add Nb because soft magnetism is likely to be obtained.

The aforementioned resistivity of the CoMT alloys become about 100 to 200 $\mu\Omega$cm.

The antiferromagnetic layer 30 is preferably formed from a PtMn alloy. The PtMn alloys are superior in corrosion resistance properties, have a high blocking temperature, and have a large exchange coupling magnetic field, compared to the NiMn alloys and FeMn alloys, etc., being conventionally used as antiferromagnetic layers.

The antiferromagnetic layer 30 may be formed from an alloy represented by the formula X—Mn, where X is one element selected from the group consisting of Pt, Pd, Ru, Ir, Rh, and Os, or an alloy represented by the formula X'—Pt—Mn, where X' is one or more elements selected from the group consisting of Pd, Cr, Ni, Ru, Ir, Rh, Os, Au, and Ag.

In the aforementioned PtMn alloys and the alloys represented by the formula X—Mn, Pt or X is preferably within the range 37 to 63 atom %, more preferably, 44 to 57 atom %.

Furthermore, in the alloys represented by the formula X'—Pt—Mn, X' is preferably within the range 37 to 63 atom %, it is more preferably within the range 44 to 57 atom %.

By using the aforementioned alloy having a composition within the proper range, as the antiferromagnetic layer 30, and by heat-treating said alloy in the magnetic field, the antiferromagnetic layer 30, generating a large exchange coupling magnetic field, can be obtained. In particular, in the case in which the PtMn alloy is used, superior antiferromagnetic layer 30, having an exchange coupling magnetic field of more than $6.4\times10^4$ A/m, and having a very high blocking temperature of 653 K (380° C.), at which the exchange coupling magnetic field disappears, can be obtained.

The pinned magnetic layer 25 is composed of a nonmagnetic layer 28, and the first pinned magnetic layer 26 and the second pinned magnetic layer 27 holding said nonmagnetic layer 28 therebetween. The first pinned magnetic layer 26 is provided in the side nearer to the antiferromagnetic layer 30 than the nonmagnetic layer 28, and is in contact with the antiferromagnetic layer 30. The second pinned magnetic layer 27 is provided in the side nearer to the nonmagnetic conductive layer 29 than the nonmagnetic layer 28, and is in contact with the nonmagnetic conductive layer 29.

On the boundary of the first pinned magnetic layer 26 and the antiferromagnetic layer 30, an exchange coupling magnetic field (an exchange anisotropic magnetic field) is generated, and the direction of magnetization of the first pinned magnetic layer 26 is pinned in the direction opposite to the Y direction shown in the drawings.

The thicknesses of the first pinned magnetic layer 26 and the second pinned magnetic layer 27 are preferably slightly different from each other, and in FIG. 1 and FIG. 2, the thickness of the second pinned magnetic layer 27 is made to be greater than the thickness of the first pinned magnetic layer 26.

The direction of magnetization of the first pinned magnetic layer 26 is pinned in the direction opposite to the Y direction shown in the drawings by the exchange coupling magnetic field with the antiferromagnetic layer 30. The second pinned magnetic layer 27 is antiferromagnetically coupled to the first pinned magnetic layer 26, and its direction of magnetization is pinned in the Y direction.

Because the directions of magnetization of the first and second pinned magnetic layers 26 and 27 are made to be antiparallel to each other, magnetic moments of the first and second pinned magnetic layers 26 and 27 offset each other. However, as the thickness of the second pinned magnetic layer 27 is slightly greater, a spontaneous magnetization of the pinned magnetic layer 25 itself results in it slightly remaining to enter the ferrimagnetic state. Then, the spontaneous magnetization is further amplified by the exchange coupling magnetic field with the antiferromagnetic layer 30 to pin the direction of magnetization of the pinned magnetic layer 25 in the Y direction shown in the drawings.

Therefore, the direction of magnetization of the free magnetic layer 20, and the direction of magnetization of the pinned magnetic layer 25 are in crossed relation to each other.

The first pinned magnetic layer 26 and the second pinned magnetic layer 27 are both formed from ferromagnetic materials, and are formed from, for example, the NiFe alloy, Co, the CoNiFe alloy, the CoFe alloy, the CoNi alloy, etc. In particular, these are preferably formed from Co. The first and second pinned magnetic layers 26 and 27 are preferably formed from the same materials.

The nonmagnetic layer 28 is formed of nonmagnetic materials, and is preferably formed from one selected from the group consisting of Ru, Rh, Ir, Cr, Re, and Cu or alloys thereof. In particular, it is preferably formed from Ru.

The nonmagnetic conductive layer 29 prevents the magnetic coupling of the pinned magnetic layer 25 and the free magnetic layer 20, and is the layer through which the sensing current flows primarily. The layer 29 is preferably formed from a conductive nonmagnetic material represented by Cu, Cr, Au, Ag, etc., and in particular, is preferably formed from Cu.

The spin valve thin film magnetic element 1 is manufactured, for example, as follows.

Figure 5:
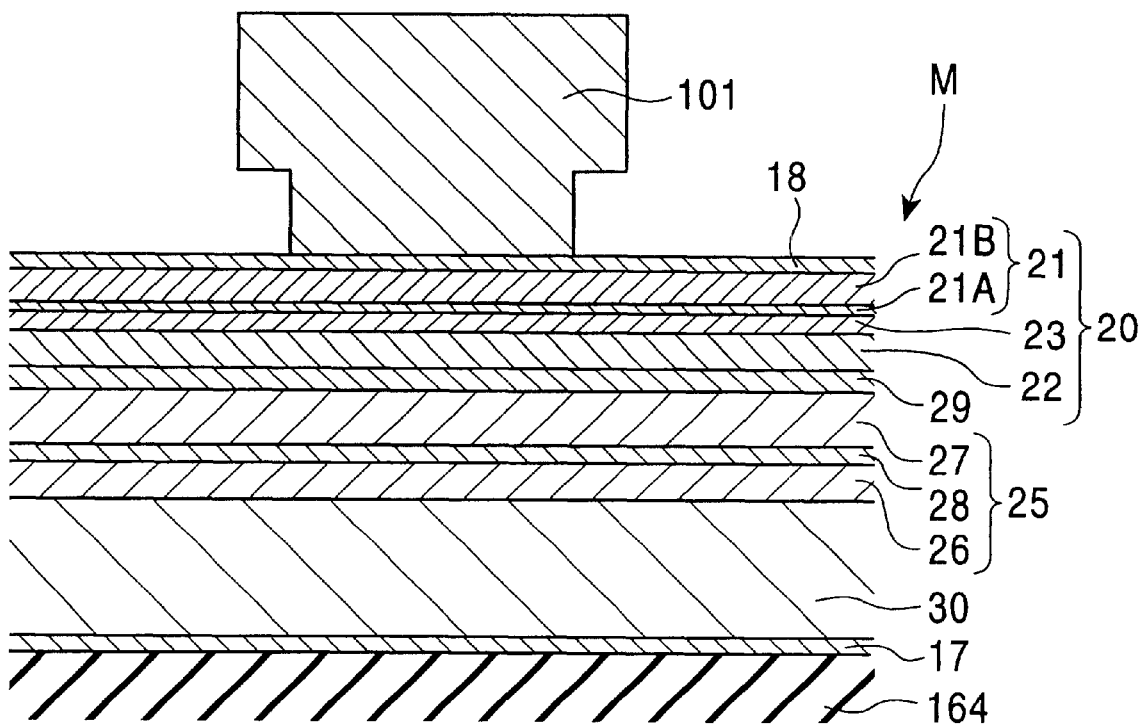
FIG. 5 is a schematic figure illustrating one step of a manufacturing process of a spin valve thin film magnetic element according to the first embodiment of the present invention.

As shown in FIG. 5, the substrate layer 17, the antiferromagnetic layer 30, the pinned magnetic layer 25 (the first pinned magnetic layer 26, the nonmagnetic layer 28, and the second pinned magnetic layer 27), the nonmagnetic conductive layer 29, the free magnetic layer 20 (the second free magnetic layer 22, the nonmagnetic intermediate layer 23, and the first free magnetic layer 21), and the cap layer 18 are orderly formed into films to form a laminated film M on the lower gap layer 164, and thereafter, a lift-off resist 101 is formed on the laminated film M.

The first free magnetic layer 21 is formed by laminating the first ferromagnetic layer 21A and the second ferromagnetic layer 21B.

Figure 6:
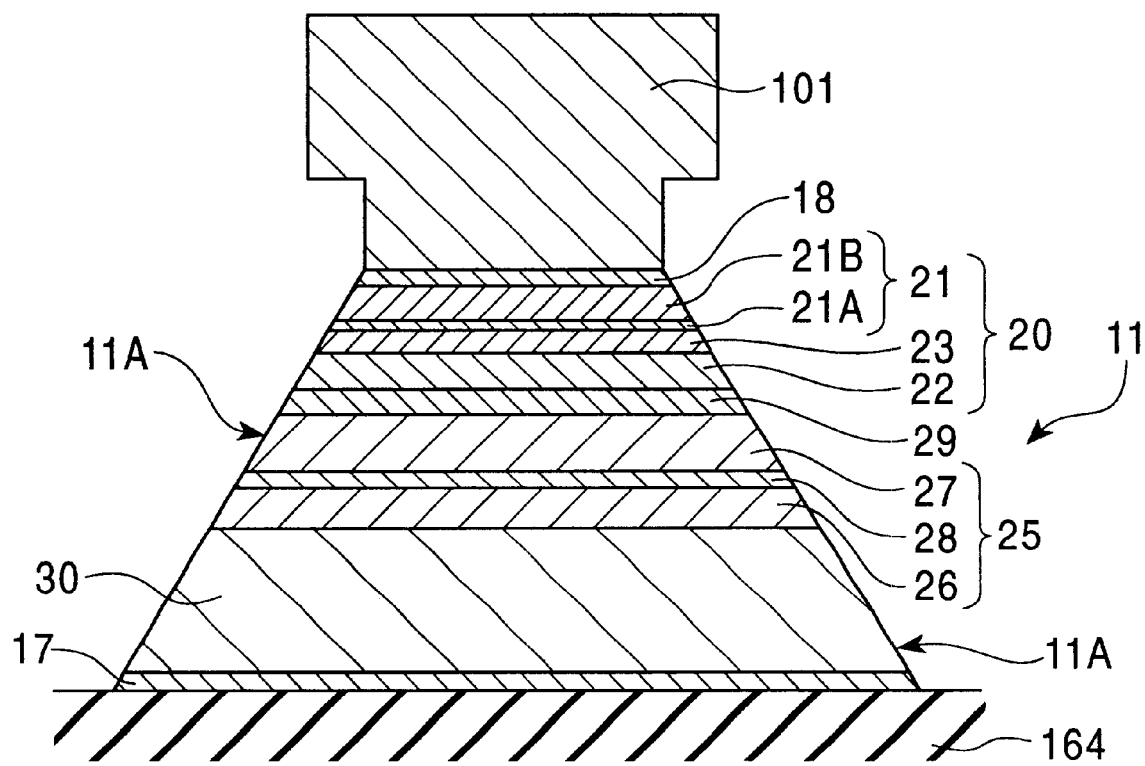
FIG. 6 is a schematic figure illustrating one step of a manufacturing process of a spin valve thin film magnetic element according to the first embodiment of the present invention.

Then, as shown in FIG. 6, inclined faces, made to become side faces 11A and 11A, are formed by removing the part, not covered with the lift-off resist 101, using an ion milling, to form the laminate 11 having an isosceles trapezoid shape.

Figure 7:
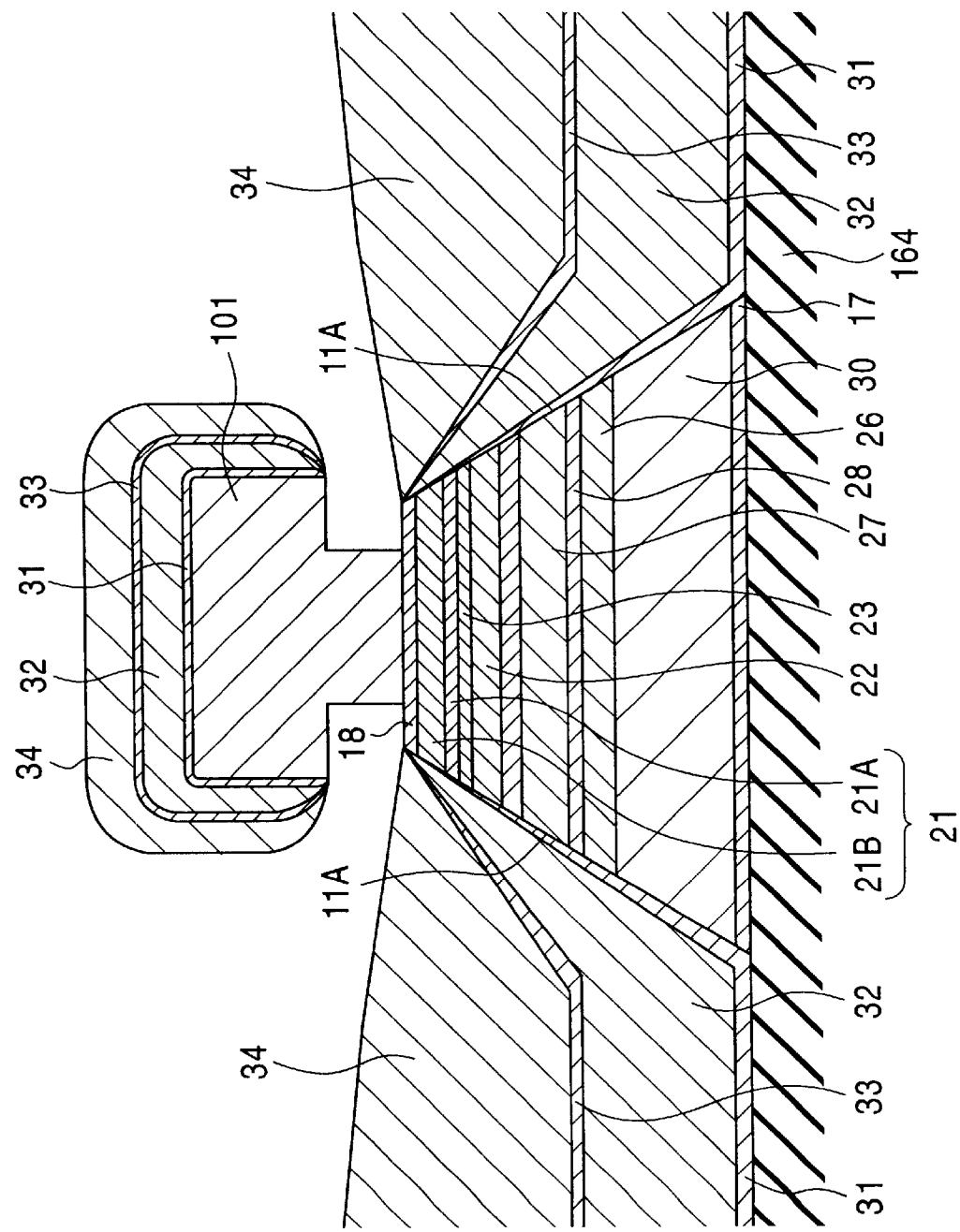
FIG. 7 is a schematic figure illustrating one step of a manufacturing process of a spin valve thin film magnetic element according to the first embodiment of the present invention.

Thereafter, as shown in FIG. 7, the bias substrate layers 31, the bias layers 32, the intermediate layers 33, and the conductive layers 34 are orderly laminated on the lift-off resist 101 and both sides of the laminate 11.

Figure 8:
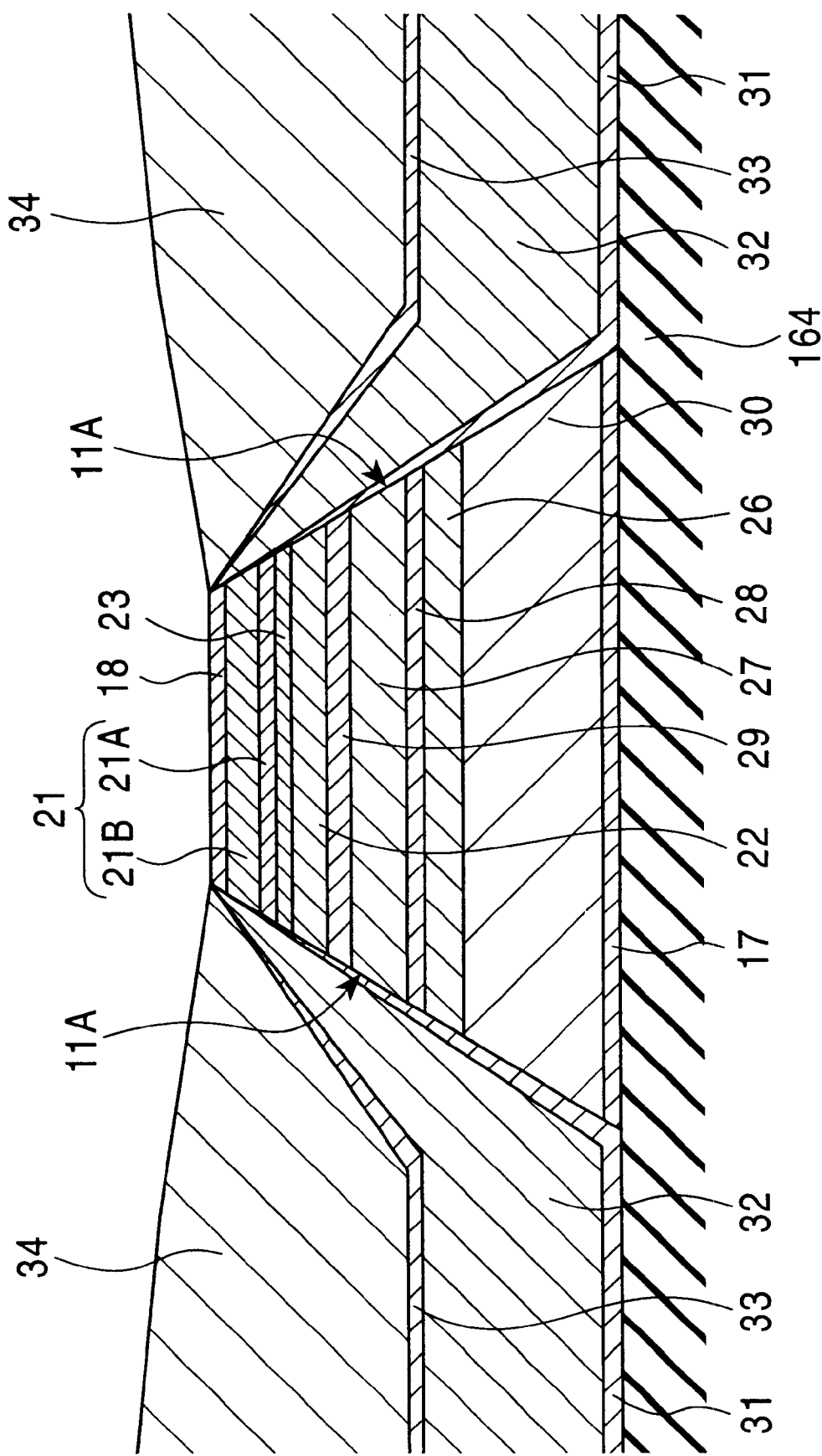
FIG. 8 is a schematic figure illustrating one step of a manufacturing process of a spin valve thin film magnetic element according to the first embodiment of the present invention.

Lastly, as shown in FIG. 8, by removing the lift-off resist 101, the spin valve thin film magnetic element 1 is obtained.

According to the aforementioned spin valve thin film magnetic element 1, because the second ferromagnetic layer 21B, constituting the first free magnetic layer 21, is composed of the NiFeX alloy or the CoMT alloy, the resistivity of the second ferromagnetic layer 21B becomes higher than the resistivity of the second free magnetic layer 22 to suppress the shunt of the sensing current, and it becomes possible to reduce the shunt loss and to increase the rate of change in magnetoresistance.

The first free magnetic layer 21 is composed of the aforementioned second ferromagnetic layer 21B, and the first ferromagnetic layer 21A in contact with the nonmagnetic intermediate layer 23 and made of the NiFe alloy. The ferromagnetic layer 21A, exhibiting a higher saturation magnetic flux density than the second ferromagnetic layer 21B and being ferromagnetic, is antiferromagnetically coupled to the second free magnetic layer 22; then, it is possible to make the first free magnetic layer 21 and the second free magnetic layer 22 enter the ferrimagnetic state.

Second Embodiment

The second embodiment of the present invention will be explained referring to the drawings.

Figure 9:
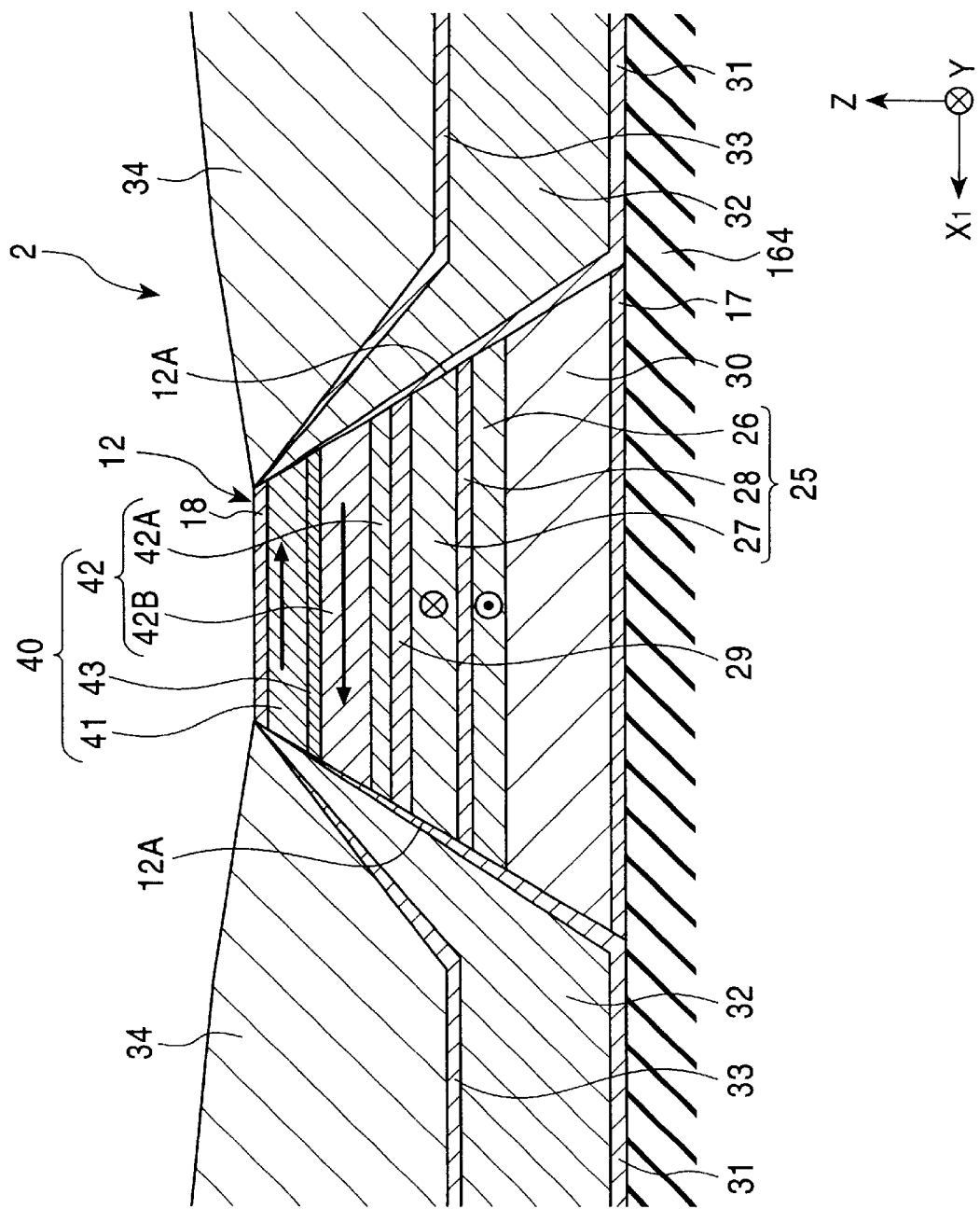
FIG. 9 is a schematic sectional view of a spin valve thin film magnetic element according to the second embodiment of the present invention viewed from a magnetic recording medium side.
Figure 10:
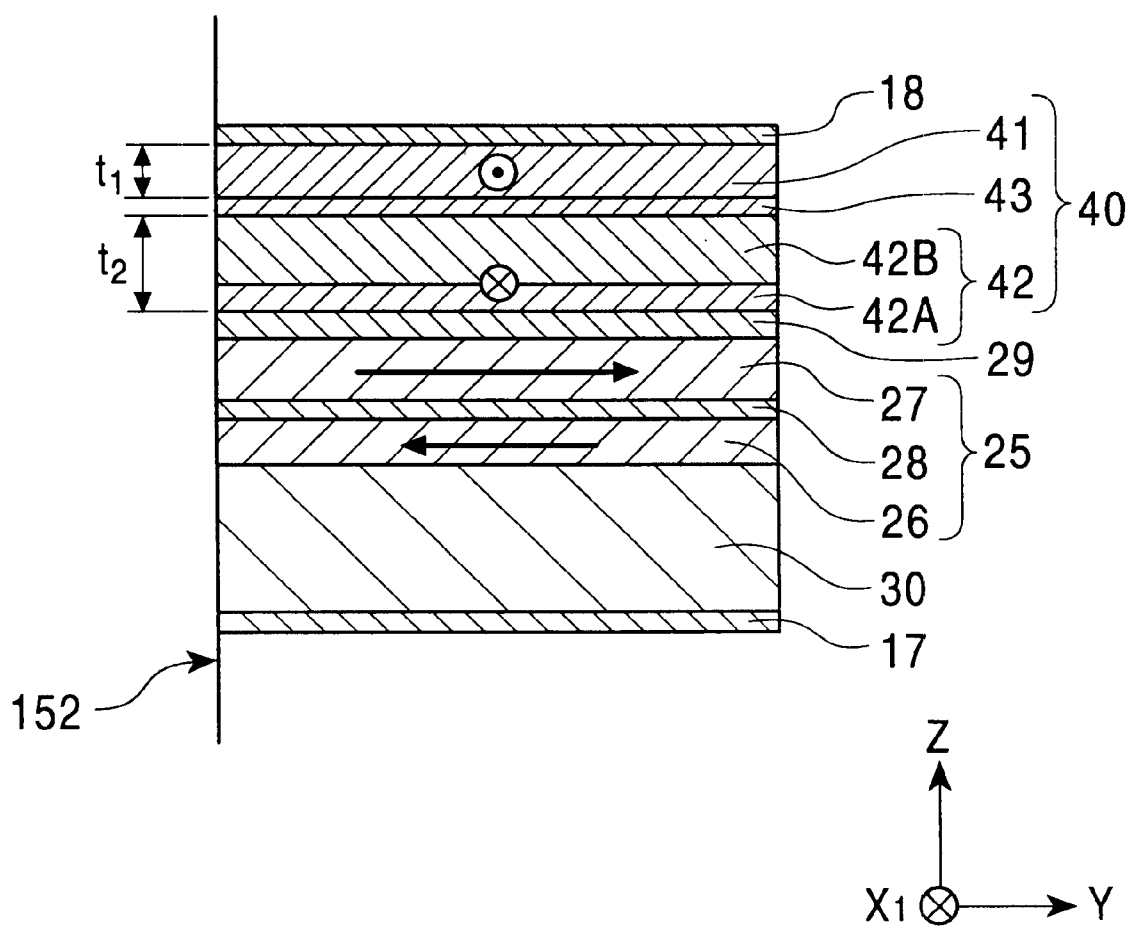
FIG. 10 is a schematic sectional view of the spin valve thin film magnetic element shown in FIG. 9 viewed from a track width direction.

FIG. 9 is a schematic sectional view of a spin valve thin film magnetic element 2 according to the second embodiment of the present invention viewed from a magnetic recording medium side, and FIG. 10 is a schematic sectional view of the spin valve thin film magnetic element 2 viewed from a track width direction.

Among constituent elements shown in FIG. 9 and FIG. 10, the constituent elements which are the same as the constituent elements shown in FIG. 1 and FIG. 2, are marked with the same numerals in FIG. 1 and FIG. 2, and explanations are omitted or simplified.

In FIG. 9 and FIG. 10, the Z direction shown in drawings is a direction of movement of the magnetic recording medium, the Y direction shown in drawings is a direction of a leakage magnetic field of the magnetic recording medium, and the $X_1$ direction shown in drawings is the track width direction of the spin valve thin film magnetic element 2.

The spin valve thin film magnetic element 2 shown in FIG. 9 and FIG. 10 is, similarly to the spin valve thin film magnetic element 1 according to the first embodiment, provided in the thin film magnetic head $h_1$ to constitute a floating magnetic head.

The spin valve thin film magnetic element 2 is, similarly to the spin valve thin film magnetic element 1 according to the first embodiment, a bottom type single spin valve thin film magnetic element constituted by orderly laminating a substrate layer 17, an antiferromagnetic layer 30, a pinned magnetic layer 25, a nonmagnetic conductive layer 29, a free magnetic layer 40, and a cap layer 18.

In FIG. 9, the numeral 164 shows a lower gap layer, and the numeral 17 shows a substrate layer laminated on the lower gap layer 164. The antiferromagnetic layer 30 is laminated on the substrate layer 17, the pinned magnetic layer 25 is laminated on the antiferromagnetic layer 30, the nonmagnetic conductive layer 29 formed from Cu, etc., is laminated on the pinned magnetic layer 25, the free magnetic layer 40 is laminated on the nonmagnetic conductive layer 29, and a cap layer 18 formed from Ta, etc., is laminated on the free magnetic layer 40.

Thus, each layer from the substrate layer 17 to the cap layer 18 is orderly laminated to constitute a laminate 12, having a width meeting the track width, and having a nearly trapezoidal shape in sectional view.

The free magnetic layer 40 is composed of a nonmagnetic intermediate layer 43, and the first free magnetic layer 41 and the second free magnetic layer 42, holding the nonmagnetic intermediate layer 43 therebetween, and being antiferromagnetically coupled to enter the ferrimagnetic state.

The pinned magnetic layer 25 is, similarly to the first embodiment, composed of a nonmagnetic layer 28, and the first pinned magnetic layer 26 and the second pinned magnetic layer 27 holding the nonmagnetic layer 28 therebetween.

The spin valve thin film magnetic element 2 is different from the aforementioned spin valve thin film magnetic element 1 in that the first free magnetic layer 41 is composed of a single layer made of the NiFeX alloy or the CoMT alloy.

A pair of bias layers 32 and 32 is formed on both sides of the laminate 12 in the $X_1$ direction shown in the drawings. The bias layers 32 and 32 are formed, going aground on both sides 12A and 12A of the laminate 12 from the upper side of the lower gap layer 164.

Conductive layers, indicated by the reference numerals 34 and 34, are laminated above the bias layers 32 and 32. The conductive layers 34 and 34 apply a sensing current to the laminate 12.

Bias substrates 31 are provided between the bias layers 32 and 32, and the lower gap layer 164, and between the bias layers 32 and 32, and the laminate 12, and intermediate layers 33 and 33 are provided between the bias layers 32 and 32, and the conductive layers 34 and 34.

As shown in FIG. 9 and FIG. 10, the free magnetic layer 40 is composed of a nonmagnetic intermediate layer 43, and the first free magnetic layer 41 and the second free magnetic layer 42 holding the nonmagnetic intermediate layer 43 therebetween.

The first free magnetic layer 41 is provided on the side farther from the nonmagnetic conductive layer 29 than the nonmagnetic intermediate layer 43, and is in contact with the cap layer 18. On the other hand, the second free magnetic layer 42 is provided on the side nearer to the nonmagnetic conductive layer 29 than the nonmagnetic intermediate layer 43, and is in contact with the nonmagnetic conductive layer 29.

This is constituted so that the resistivity of the first free magnetic layer 41 is higher than the resistivity of the second free magnetic layer 42. That is, materials of the first and second free magnetic layers 41 and 42 are appropriately selected so that the material of the first free magnetic layer 41 has a higher resistance than the material of the second free magnetic layer 42.

The thickness $t_2$ of the second free magnetic layer 42 is preferably formed to be greater than the thickness $t_1$ of the first free magnetic layer 41.

The thickness $t_1$ of the first free magnetic layer 41, as a whole, is preferably within the range 0.5 to 3 nm.

The first free magnetic layer 41 is preferably composed of the NiFeX alloy or the CoMT alloy having a higher resistivity than Co, the CoFe alloy, the NiFe alloy, the CoNi alloy, the CoNiFe alloy, etc., where the element X is one or more elements selected from the group consisting of Cr, V, Nb, Hf, Ta, Mo, and W, the element M is one of Zr and Hf, or both, and the element T is one of Nb and Ta, or both.

The first free magnetic layer 41 may be constituted so that a part of said first free magnetic layer, being adjacent to the nonmagnetic intermediate layer 43, is made of a NiFe alloy phase; a part, being in the side farther from the nonmagnetic intermediate layer 43, is made of either a NiFeX alloy phase or a CoMT alloy phase; and a composition of a part held between said NiFe alloy phase, and said NiFeX alloy phase or CoMT alloy phase, is gradually changed from the NiFe alloy phase to the NiFeX alloy phase or CoMT alloy phase, as the distance from the nonmagnetic intermediate layer is increased.

The nonmagnetic intermediate layer 43 is formed from a nonmagnetic material, and is preferably formed from one selected from the group consisting of Ru, Rh, Ir, Cr, Re, and Cu, or an alloy thereof, and in particular, is preferably formed from Ru.

The second free magnetic layer 42 is composed of a diffusion preventing layer 42A and the third ferromagnetic layer 42B. The diffusion preventing layer 42A is made of a ferromagnetic material, and is formed from, for example, Co. The diffusion preventing layer 42A prevents the mutual diffusion of the third ferromagnetic layer 42B and the nonmagnetic conductive layer 29.

The diffusion preventing layer 42A and the third ferromagnetic layer 42B are composed of materials equivalent to the diffusion preventing layer 22A and the third ferromagnetic layer 22B explained in the first embodiment.

The thickness $t_2$ of the second free magnetic layer 42 is preferably within the range 1.5 to 4.5 nm.

The NiFeX alloy and the CoMT alloy, constituting the first free magnetic layer 41, have a higher resistivity than Co, the CoFe alloy, the NiFe alloy, the CoNi alloy, and the CoNiFe alloy, constituting the second free magnetic layer 42 (the diffusion preventing layer 42A and the third ferromagnetic layer 42B). Each composition of the NiFeX alloy and the CoMT alloy is similar to the composition explained in the first embodiment.

Therefore, the resistivity of the first free magnetic layer 41 becomes higher than the resistivity of the second free magnetic layer 42, and the sensing current becomes difficult to flow through the first free magnetic layer 41.

Therefore, the sensing current, flowing through the laminate 12, flows primarily through the nonmagnetic conductive layer 29, the pinned magnetic layer 25, and the second free magnetic layer 42 to suppress the shunt of the sensing current.

Because the giant magnetoresistive effect of the spin valve thin film magnetic element 2 is, similarly to the spin valve thin film magnetic element 1 according to the first embodiment, generated at the boundaries of the nonmagnetic conductive layer 29, and the second free magnetic layer 42 and the pinned magnetic layer 25, by constituting the first free magnetic layer 41 with a high resistivity material and constituting so that the sensing current flows in the periphery of the nonmagnetic conductive layer 29, the conducted electrons, contributing to the giant magnetoresistive effect, may be increased and the rate of change in magnetoresistance may be increased.

The thickness $t_2$ of the second free magnetic layer 42 is preferably formed to be greater than the thickness $t_1$ of the first free magnetic layer 41.

In particular, when the saturation magnetization of the first free magnetic layer 41 and the second free magnetic layer 42 are indicated by $M_1$ and $M_2$, respectively, and the magnetic film thickness of the first free magnetic layer 41 and the second free magnetic layer 42 are indicated by $M_1 \cdot t_1$ and $M_2 \cdot t_2$, respectively, it is more preferably constituted so that the magnetic film thickness of the first free magnetic layer 41 and the magnetic film thickness of the second free magnetic layer 42 are made to fulfill the relation $M_2 \cdot t_2 > M_1 \cdot t_1$.

Thus, when the thickness or magnetic film thickness of the second free magnetic layer 42 is greater than the thickness or magnetic film thickness of the first free magnetic layer 41, the first free magnetic layer 41 and the second free magnetic layer 42 are antiferromagnetically coupled, and as shown in FIG. 9 and FIG. 10, the direction of magnetization of the second free magnetic layer 42 is oriented in the $X_1$ direction shown in the drawings, by the bias layers 32 and 32, the direction of magnetization of the first free magnetic layer 41 is oriented in the direction opposite to the $X_1$ direction.

When the magnetic film thickness of the first and second free magnetic layer 41 and 42 are made to fulfill the relation $M_2 \cdot t_2 > M_1 \cdot t_1$, it enters the state where the magnetization of the second free magnetic layer 42 remains, and the direction of magnetization of the free magnetic layer 40, as a whole, is oriented in the $X_1$ direction shown in the drawings.

Thus, the first free magnetic layer 41 and the second free magnetic layer 42 enter the artificial ferrimagnetic state (synthetic ferrimagnetic state).

The free magnetic layer 40, thus made to enter the ferrimagnetic state, can have its direction of magnetization turned, even by a very weak external magnetic field, in accordance with the direction of the external magnetic field.

By making the magnetic film thickness of the first free magnetic layer 41 and the second free magnetic layer 42 fulfill the relation $M_2 \cdot t_2 > M_1 \cdot t_1$, the spin flop magnetic field of the free magnetic layer 40 can be increased, and the free magnetic layer 40 can stably maintain the ferrimagnetic state.

In the case in which a part in contact with the nonmagnetic intermediate layer 43 of the first free magnetic layer 41 is made of a NiFe alloy phase, as the NiFe alloy has a higher saturation magnetic flux density than the NiFeX alloy or the CoMT alloy and is ferromagnetic, the first free magnetic layer 41 and the second free magnetic layer 42 are likely to be antiferromagnetically coupled; then, it is possible to make the first free magnetic layer 41 and the second free magnetic layer 42 enter the ferrimagnetic state.

The antiferromagnetic layer 30 is preferably formed from a PtMn alloy. The PtMn alloy is superior in corrosion resistance properties, has a high blocking temperature, and has a large exchange coupling magnetic field, compared to the NiMn alloy, FeMn alloy, etc., being conventionally used as antiferromagnetic layers.

The pinned magnetic layer 25 is composed of a nonmagnetic layer 28, and the first pinned magnetic layer 26 and the second pinned magnetic layer 27 holding said nonmagnetic layer 28 therebetween. The first pinned magnetic layer 26 is provided on the side nearer to the antiferromagnetic layer 30 than the nonmagnetic layer 28, and is in contact with the antiferromagnetic layer 30. The second pinned magnetic layer 27 is provided on the side nearer to the nonmagnetic conductive layer 29 than the nonmagnetic layer 28, and is in contact with the nonmagnetic conductive layer 29.

On the boundary of the first pinned magnetic layer 26 and the antiferromagnetic layer 30, an exchange coupling magnetic field (an exchange anisotropic magnetic field) is generated, and the direction of magnetization of the first pinned magnetic layer 26 is pinned in the direction opposite to the Y direction shown in the drawings.

The thickness of the second pinned magnetic layer 27 is made to be greater than the thickness of the first pinned magnetic layer 26.

The direction of magnetization of the first pinned magnetic layer 26 is pinned in the direction opposite to the Y direction shown in the drawings by the exchange coupling magnetic field with the antiferromagnetic layer 30. The second pinned magnetic layer 27 is antiferromagnetically coupled to the first pinned magnetic layer 26, and its direction of magnetization is pinned in the Y direction shown in the drawings.

Because the directions of magnetization of the first and second pinned magnetic layers 26 and 27 are made to be antiparallel to each other, magnetic moments of the first and second pinned magnetic layers 26 and 27 are in a relation offsetting each other. However, as the thickness of the second pinned magnetic layer 27 is slightly greater, a spontaneous magnetization of the pinned magnetic layer 25 itself results in it slightly remaining to become the ferrimagnetic state. Then, the spontaneous magnetization is further amplified by the exchange coupling magnetic field with the antiferromagnetic layer 30 to pin the direction of magnetization of the pinned magnetic layer 25 in the Y direction shown in the drawings.

The first pinned magnetic layer 26 and the second pinned magnetic layer 27 are both formed from ferromagnetic materials, and are made of materials equivalent to the first and second pinned magnetic layers explained in the first embodiment. The nonmagnetic layer 28 is made of nonmagnetic materials, and is made of materials equivalent to the nonmagnetic layer explained in the first embodiment.

The nonmagnetic conductive layer 29 prevents the magnetic coupling of the pinned magnetic layer 25 and the free magnetic layer 40, and is the layer through which the sensing current primarily flows. It is preferably formed from conductive nonmagnetic materials represented by Cu, Cr, Au, Ag, etc., and in particular, is preferably formed from Cu.

The spin valve thin film magnetic element 2 is manufactured in nearly the same manner as in the case of the spin valve thin film magnetic element 1 according to the first embodiment, except for forming the first free magnetic layer from a single layer of either NiFex alloy or CoMT alloy.

According to the aforementioned spin valve thin film magnetic element 2, because the first free magnetic layer 41 is composed of the NiFeX alloy or the CoMT alloy, the resistivity of the first free magnetic layer 41 becomes higher than the resistivity of the second free magnetic layer 42 to suppress the shunt of the sensing current, and it becomes possible to reduce the shunt loss and to increase the rate of change in magnetoresistance.

In the case in which a part in contact with the nonmagnetic intermediate layer 43, of the first free magnetic layer 41 is made of a NiFe alloy phase, and a part, being in the side farther from the nonmagnetic intermediate layer 29 than the nonmagnetic intermediate layer 43, is made of either a NiFeX alloy phase or a CoMT alloy phase, as the NiFe alloy has a higher saturation magnetic flux density than the NiFeX alloy or the CoMT alloy, and is ferromagnetic, the first free magnetic layer 41 and the second free magnetic layer 42 are likely to be antiferromagnetically coupled; then, it is possible to make the first and second free magnetic layers 41 and 42 enter the ferrimagnetic state.

Third Embodiment

The third embodiment of the present invention will be explained referring to the drawings.

Figure 11:
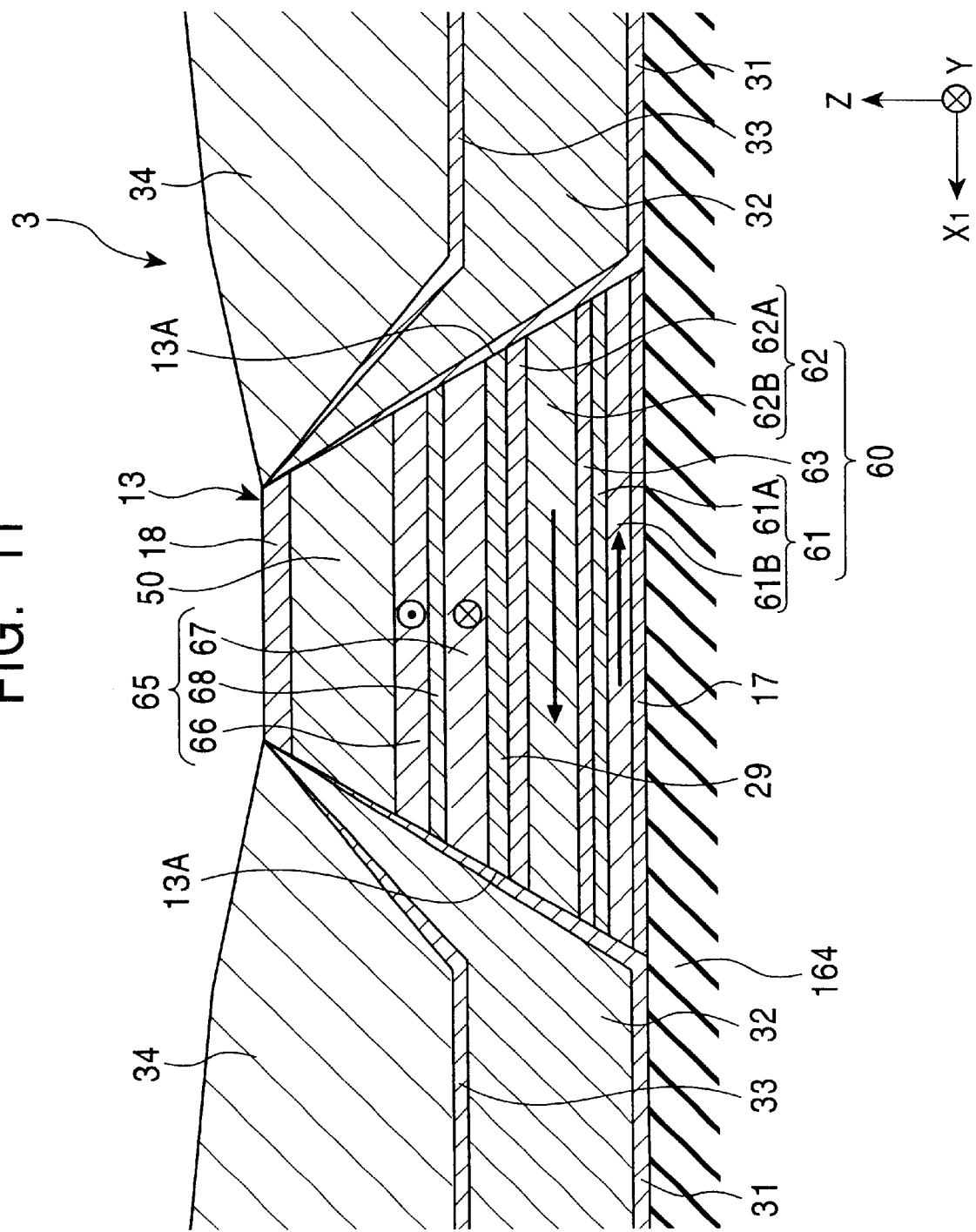
FIG. 11 is a schematic sectional view of a spin valve thin film magnetic element according to the third embodiment of the present invention viewed from a magnetic recording medium side.
Figure 12:
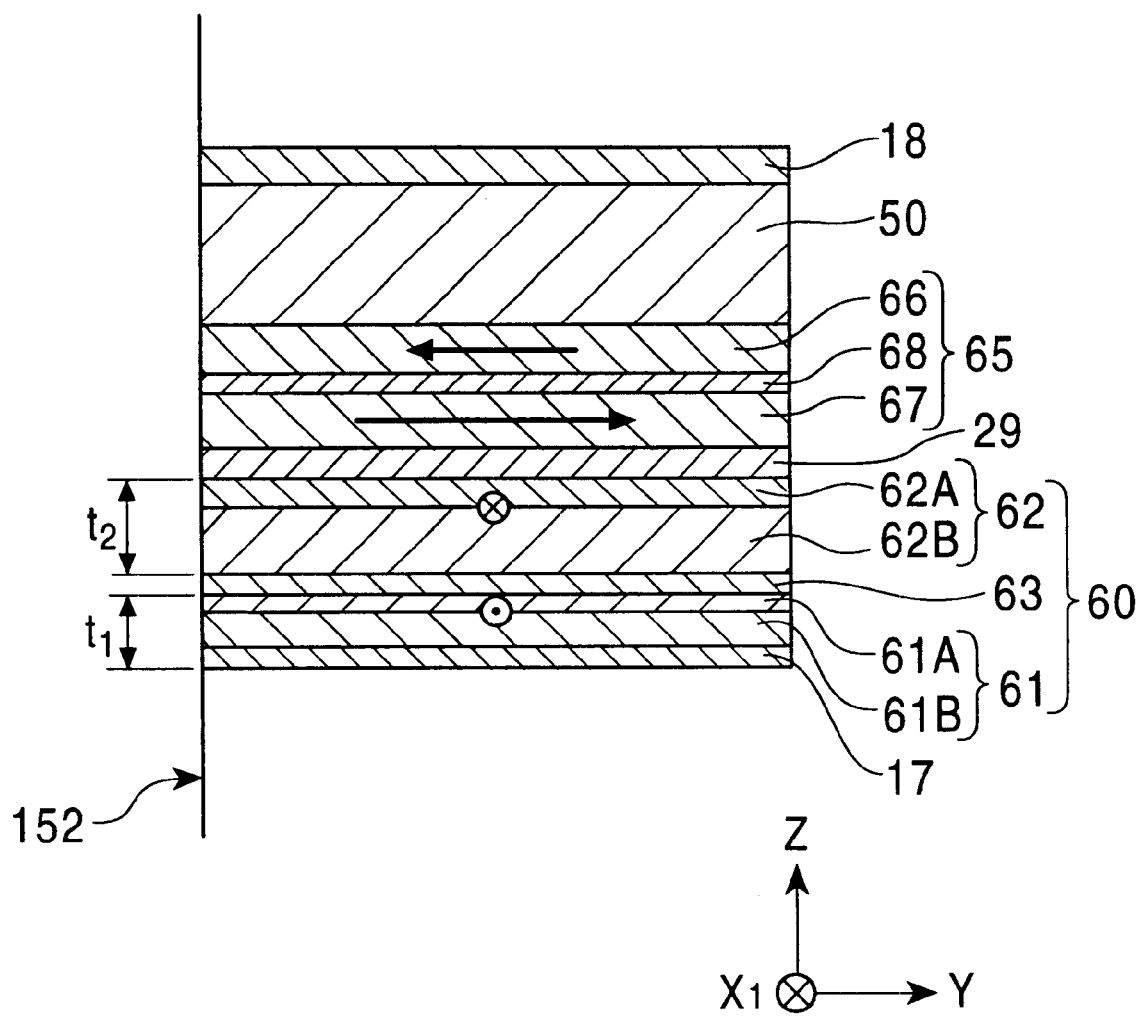
FIG. 12 is a schematic sectional view of the spin valve thin film magnetic element shown in FIG. 11 viewed from a track width direction.

FIG. 11 is a schematic sectional view of a spin valve thin film magnetic element 3 according to the third embodiment of the present invention viewed from a magnetic recording medium side, and FIG. 12 is a schematic sectional view of the spin valve thin film magnetic element 3 viewed from a track width direction.

Among constituent elements shown in FIG. 11 and FIG. 12, the constituent elements which are the same as the constituent elements shown in FIG. 1, FIG. 2, FIG. 9, and FIG. 10, are indicated by the same numerals as in FIG. 1, FIG. 2, FIG. 9, and FIG. 10, and explanations thereof are omitted or simplified.

In FIG. 11 and FIG. 12, the Z direction shown in drawings is a direction of movement of the magnetic recording medium, the Y direction shown in drawings is a direction of a leakage magnetic field of the magnetic recording medium, and the $X_1$ direction shown in drawings is the track width direction of the spin valve thin film magnetic element 3.

The spin valve thin film magnetic element 3 shown in FIG. 11 and FIG. 12 is, similarly to the spin valve thin film magnetic element 1 according to the first embodiment, provided in the thin film magnetic head $h_1$, to constitute a floating magnetic head.

The spin valve thin film magnetic element 3 is a top type single spin valve thin film magnetic element constituted by orderly laminating a free magnetic layer 60, a nonmagnetic conductive layer 29, a pinned magnetic layer 65, and an antiferromagnetic layer 50.

In FIG. 11, the numeral 164 shows a lower gap layer, and the numeral 17 shows a substrate layer laminated on the lower gap layer 164. The free magnetic layer 60 is laminated on the substrate layer 17, the nonmagnetic conductive layer 29 is laminated on the free magnetic layer 60, the pinned magnetic layer 65 is laminated on the nonmagnetic conductive layer 29, the antiferromagnetic layer 50 is laminated on the pinned magnetic layer 65, and a cap layer 18 is laminated on the antiferromagnetic layer 50.

Thus, each layer from the substrate layer 17 to the cap layer 18 is orderly laminated to constitute a laminate 13, having a width matching the track width, and having a nearly trapezoidal shape in sectional view.

The free magnetic layer 60 is composed of a nonmagnetic intermediate layer 63, and the first free magnetic layer 61 and the second free magnetic layer 62, holding the nonmagnetic intermediate layer 63 therebetween, and being antiferromagnetically coupled to enter the ferrimagnetic state.

The pinned magnetic layer 65 is composed of a nonmagnetic layer 68, and the first pinned magnetic layer 66 and the second pinned magnetic layer 67 holding the nonmagnetic layer 68 therebetween.

A pair of bias layers 32 and 32 is formed on both sides of the laminate 13 in the $X_1$ direction shown in the drawings.

The bias layers 32 and 32 are formed, going aground on both sides 13A and 13A of the laminate 13, from the upper side of the lower gap layer 164.

Conductive layers, indicated by the reference numerals 34 and 34, are laminated above the bias layers 32 and 32. The conductive layers 34 and 34 apply a sensing current to the laminate 13.

Bias substrates 31 are provided between the bias layers 32 and 32, and the lower gap layer 164, and between the bias layers 32 and 32, and the laminate 13. Intermediate layers 33 and 33 are provided between the bias layers 32 and 32, and the conductive layers 34 and 34.

As shown in FIG. 11 and FIG. 12, the free magnetic layer 60 is composed of a nonmagnetic intermediate layer 63, and the first free magnetic layer 61 and the second free magnetic layer 62 holding the nonmagnetic intermediate layer 63 therebetween.

The first free magnetic layer 61 is provided on the side farther from the nonmagnetic conductive layer 29 than the nonmagnetic intermediate layer 63, and is in contact with the substrate 17. On the other hand, the second free magnetic layer 62 is provided on the side nearer to the nonmagnetic conductive layer 29 than the nonmagnetic intermediate layer 63, and is in contact with the nonmagnetic conductive layer 29.

This is constituted so that the resistivity of the first free magnetic layer 61 is higher than the resistivity of the second free magnetic layer 62. That is, materials constituting the first and second free magnetic layers 61 and 62 are properly selected so that the material of the first free magnetic layer 61 has a higher resistance than the material of the second free magnetic layer 62.

The thickness $t_2$ of the second free magnetic layer 62 is preferably formed to be greater than the thickness $t_1$ of the first free magnetic layer 61.

The first free magnetic layer 61 is composed of the first ferromagnetic layer 61A, in contact with the nonmagnetic intermediate layer 63, and the second ferromagnetic layer 61B, in contact with the first ferromagnetic layer 61A, and is laminated on the substrate 17. The second ferromagnetic layer 61B is made to have a higher resistivity than the first ferromagnetic layer 61A. That is, materials of the first and second ferromagnetic layers 61A and 61B are properly selected so that the material of the second ferromagnetic layer 61B has a higher resistance than the material of the first ferromagnetic layer 61A.

The thickness s of the first ferromagnetic layer 61A is preferably within the range 0 nm<s≦1 nm.

The thickness $t_1$ of the first free magnetic layer 61, as a whole, is preferably within the range 0.5 to 3 nm.

The first ferromagnetic layer 61A is preferably composed of a NiFe alloy, similarly to the first ferromagnetic layer 21A of the first embodiment.

The second ferromagnetic layer 61B is preferably composed of a NiFe alloy or a CoMT alloy having a higher resistivity than a NiFe alloy, similarly to the second ferromagnetic layer 21B of the first embodiment, where the element X is one or more elements selected from the group consisting of Cr, V, Nb, Hf, Ta, Mo, and W, the element M is one of Zr and Hf, or both, and the element T is one of Nb and Ta, or both. Each composition of the NiFeX alloy and the CoMT alloy is similar to the composition explained in the first embodiment.

The nonmagnetic intermediate layer 63 is formed from a nonmagnetic material, and is preferably formed from one selected from the group consisting of Ru, Rh, Ir, Cr, Re, and Cu, or an alloy thereof. In particular, it is preferably formed from Ru.

The second free magnetic layer 62 is composed of a diffusion preventing layer 62A and the third ferromagnetic layer 62B. The diffusion preventing layer 62A is made of a ferromagnetic material, and is formed from, for example, Co. The diffusion preventing layer 62A prevents the mutual diffusion of the third ferromagnetic layer 62B and the nonmagnetic conductive layer 29.

The diffusion preventing layer 62A and the third ferromagnetic layer 62B are composed of materials equivalent to the diffusion preventing layer 22A and the third ferromagnetic layer 22B explained in the first embodiment.

The thickness $t_2$ of the second free magnetic layer 62 is preferably within the range 1.5 to 4.5 nm.

The NiFeX alloy and the CoMT alloy, constituting the second ferromagnetic layer 61B of the first free magnetic layer 61, have a higher resistivity than the NiFe alloy constituting the first ferromagnetic layer 61A, and Co, the CoFe alloy, the NiFe alloy, the CoNi alloy, and the CoNiFe alloy, constituting the second free magnetic layer 62 (the diffusion preventing layer 62A and the third ferromagnetic layer 62B).

Therefore, by constituting the second ferromagnetic layer 61B with the NiFeX alloy or the CoMT alloy, the resistivity of the first free magnetic layer 61, as a whole, becomes higher than the resistivity of the second free magnetic layer 62, and the sensing current becomes difficult to flow through the first free magnetic layer 61.

Therefore, the sensing current, flowing through the laminate 13, primarily flows through the nonmagnetic conductive layer 29, the pinned magnetic layer 65, and the second free magnetic layer 62 to suppress the shunt of the sensing current.

Because the giant magnetoresistive effect of the spin valve thin film magnetic element 3 is, similarly to the spin valve thin film magnetic element 1 or 2 according to the first or second embodiment, generated at the boundaries of the nonmagnetic conductive layer 29, and the second free magnetic layer 62 and the pinned magnetic layer 65, by constituting the first free magnetic layer 61 with a high resistivity material and constituting it so that the sensing current flows in the periphery of the nonmagnetic conductive layer 29, the conducted electrons, contributing to the giant magnetoresistive effect, may be increased and the rate of change in magnetoresistance may be increased.

The thickness $t_2$ of the second free magnetic layer 62 is preferably formed to be greater than the thickness $t_1$ of the first free magnetic layer 61.

In particular, when the saturation magnetization of the first free magnetic layer 61 and the second free magnetic layer 62 are indicated by $M_1$ and $M_2$, respectively, and the magnetic film thickness of the first free magnetic layer 61 and the second free magnetic layer 62 are indicated by $M_1 \cdot t_1$ and $M_2 \cdot t_2$, respectively, it is more preferably constituted so that the magnetic film thickness of the first free magnetic layer 61 and the magnetic film thickness of the second free magnetic layer 62 are made to fulfill the relation $M_2 \cdot t_2 > M_1 \cdot t_1$.

Thus, when the thickness or magnetic film thickness of the second free magnetic layer 62 is greater than the thickness or magnetic film thickness of the first free magnetic layer 61, the first free magnetic layer 61 and the second free magnetic layer 62 are antiferromagnetically coupled, and as shown in FIG. 11 and FIG. 12, the direction of magnetization of the second free magnetic layer 62 is oriented in the $X_1$ direction shown in the drawings, by the bias layers 32 and 32, and the direction of magnetization of the first free magnetic layer 61 is oriented in the direction opposite to the $X_1$ direction.

When the magnetic film thickness of the first and second free magnetic layers 61 and 62 are made to fulfill the relation $M_2 \cdot t_2 > M_1 \cdot t_1$, it enters the state where the magnetization of the second free magnetic layer 62 remains, and the direction of magnetization of the free magnetic layer 60, as a whole, is oriented in the $X_1$ direction shown in the drawings.

Thus, the first free magnetic layer 61 and the second free magnetic layer 62 enter the artificial ferrimagnetic state (synthetic ferrimagnetic state).

The free magnetic layer 60, thus made to enter the artificial ferrimagnetic state, can have its direction of magnetization turned, even by a very weak external magnetic field, in accordance with the direction of the external magnetic field.

By making the magnetic film thickness of the first free magnetic layer 61 and the second free magnetic layer 62 fulfill the relation $M_2 \cdot t_2 > M_1 \cdot t_1$, the spin flop magnetic field of the free magnetic layer 60 can be increased, and the free magnetic layer 60 can stably maintain the ferrimagnetic state.

The first free magnetic layer 61, made of the NiFe alloy, has a higher saturation magnetic flux density than the second free magnetic layer 62 made of the NiFeX alloy or the CoMT alloy, and is ferromagnetic; therefore, it is likely to be antiferromagnetically coupled to the second free magnetic layer 62 to make the first free magnetic layer 61 and the second free magnetic layer 62 enter the ferrimagnetic state.

The antiferromagnetic layer 50 is preferably formed from a PtMn alloy. The PtMn alloy is superior in corrosion resistance properties, have a high blocking temperature, and have a large exchange coupling magnetic field, compared to the NiMn alloy, FeMn alloy, etc., being conventionally used as antiferromagnetic layers.

The antiferromagnetic layer 50 may be formed from an alloy represented by the formula X—Mn, where X is one element selected from the group consisting of Pt, Pd, Ru, Ir, Rh, and Os, or an alloy represented by the formula X'—Pt—Mn, where X' is one or more selected from the group consisting of Pd, Cr, Ni, Ru, Ir, Rh, Os, Au, and Ag.

In the aforementioned PtMn alloys and the alloys represented by the formula X—Mn, Pt or X is preferably within the range 37 to 63 atom %, more preferably, 47 to 57 atom %.

Furthermore, in the alloys represented by the formula X'—Pt—Mn, X' is preferably within the range 37 to 63 atom %, more preferably, 47 to 57 atom %.

By using the aforementioned alloy having a composition within the proper range, as the antiferromagnetic layer 50, and by heat-treating said alloy in the magnetic field, the antiferromagnetic layer 50 generating a large exchange coupling magnetic field can be obtained. In particular, in the case in which the PtMn alloy is used, a superior antiferromagnetic layer 50, having an exchange coupling magnetic field of more than $6.4 \times 10^4$ A/m, and having a very high blocking temperature of 653 K (380° C.), at which the exchange coupling magnetic field disappears can be provided.

The pinned magnetic layer 65 is composed of a nonmagnetic layer 68, and the first pinned magnetic layer 66 and the second pinned magnetic layer 67 holding said nonmagnetic layer 68 therebetween. The first pinned magnetic layer 66 is provided on the side nearer to the antiferromagnetic layer 50 than the nonmagnetic layer 68, and is in contact with the antiferromagnetic layer 50. The second pinned magnetic layer 67 is provided on the side nearer to the nonmagnetic conductive layer 29 than the nonmagnetic layer 68, and is in contact with the nonmagnetic conductive layer 29.

On the boundary of the first pinned magnetic layer 66 and the antiferromagnetic layer 50, an exchange coupling magnetic field (an exchange anisotropic magnetic field) is generated, and the direction of magnetization of the first pinned magnetic layer 66 is pinned in the direction opposite to the Y direction shown in the drawings.

The thickness of the second pinned magnetic layer 67 is made to be greater than the thickness of the first pinned magnetic layer 66.

The direction of magnetization of the first pinned magnetic layer 66 is pinned in the direction opposite to the Y direction shown in the drawings by the exchange coupling magnetic field with the antiferromagnetic layer 50. The second pinned magnetic layer 67 is antiferromagnetically coupled to the first pinned magnetic layer 66, and its direction of magnetization is pinned in the Y direction shown in the drawings.

Because the directions of magnetization of the first and second pinned magnetic layers 66 and 67 are made to be antiparallel to each other, magnetic moments of the first and second pinned magnetic layers 66 and 67 are in a relation offset to each other. However, as the thickness of the second pinned magnetic layer 67 is slightly greater, a spontaneous magnetization of the pinned magnetic layer 65 itself results in it slightly remaining to be in the ferrimagnetic state. Then, the spontaneous magnetization is further amplified by the exchange coupling magnetic field with the antiferromagnetic layer 50 to pin the direction of magnetization of the pinned magnetic layer 65 in the Y direction shown in the drawings.

The first pinned magnetic layer 66 and the second pinned magnetic layer 67 are both formed from ferromagnetic materials, and are made of materials equivalent to the first and second pinned magnetic layers 26 and 27 explained in the first embodiment. The nonmagnetic layer 68 is made of nonmagnetic materials, and is made of materials equivalent to the nonmagnetic layer 28 explained in the first embodiment.

The nonmagnetic conductive layer 29 prevents the magnetic coupling of the pinned magnetic layer 65 and the free magnetic layer 60, and is a layer through which the sensing current primarily flows. The layer 29 is preferably formed from a conductive nonmagnetic material represented by Cu, Cr, Au, Ag, etc., and in particular, is preferably formed from Cu.

The spin valve thin film magnetic element 3 is manufactured in a manner similar to the spin valve thin film magnetic element 1 according to the first embodiment, except that the substrate layer 17, the free magnetic layer 60 (the first free magnetic layer 61, the nonmagnetic intermediate layer 63, and the second free magnetic layer 62), the nonmagnetic conductive layer 29, the pinned magnetic layer 65 (the second pinned magnetic layer 67, the nonmagnetic layer 68, and the first pinned magnetic layer 66), the antiferromagnetic layer 50, and the cap layer 18 are orderly formed into films to form the laminated film on the lower gap layer 164.

According to the spin valve thin film magnetic element 3, effects nearly similar to the spin valve thin film magnetic element 1 according to the first embodiment can be obtained.

Fourth Embodiment

The fourth embodiment of the present invention will be explained referring to the drawings.

Figure 13:
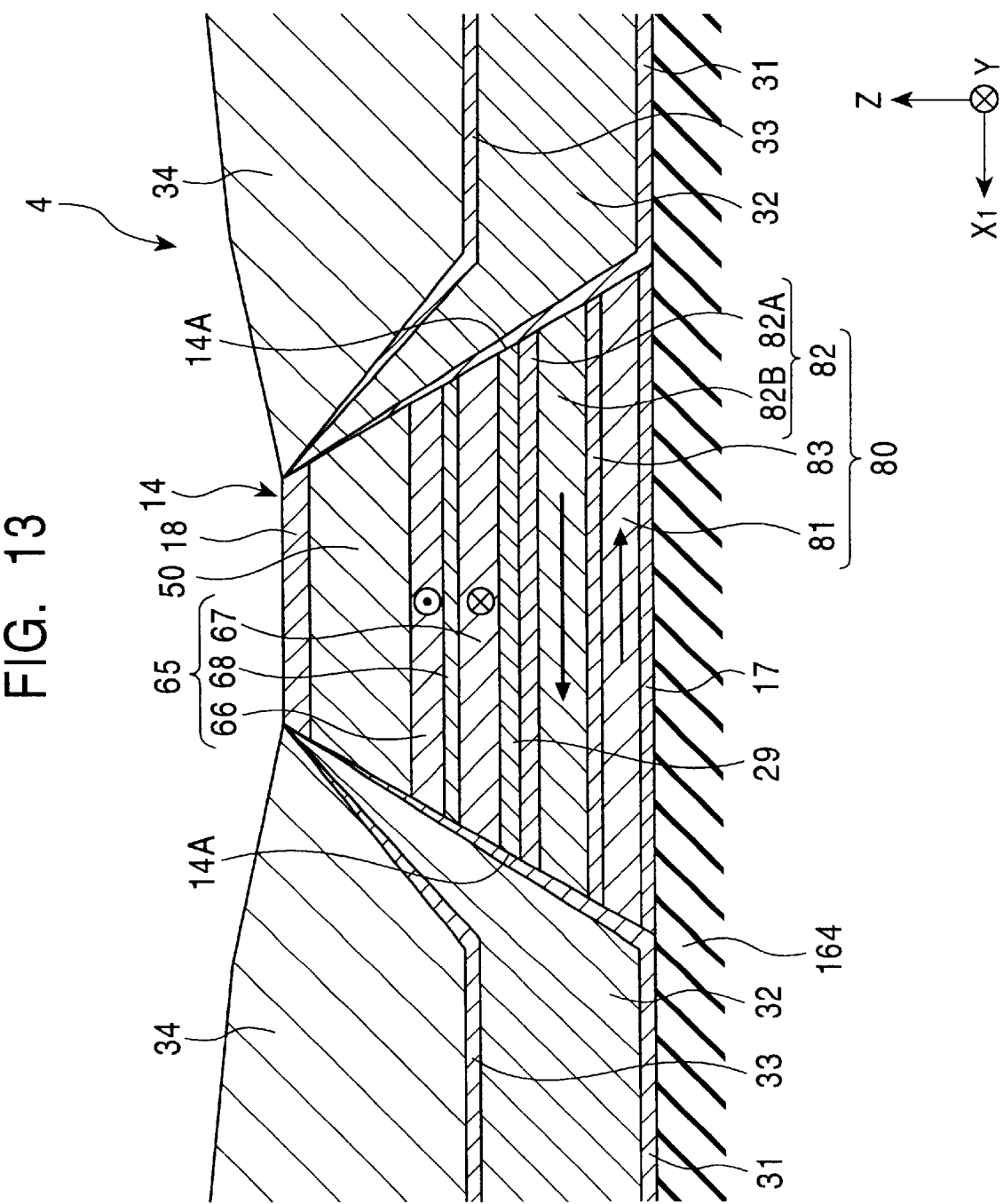
FIG. 13 is a schematic sectional view of a spin valve thin film magnetic element according to the fourth embodiment of the present invention viewed from a magnetic recording medium side.
Figure 14:
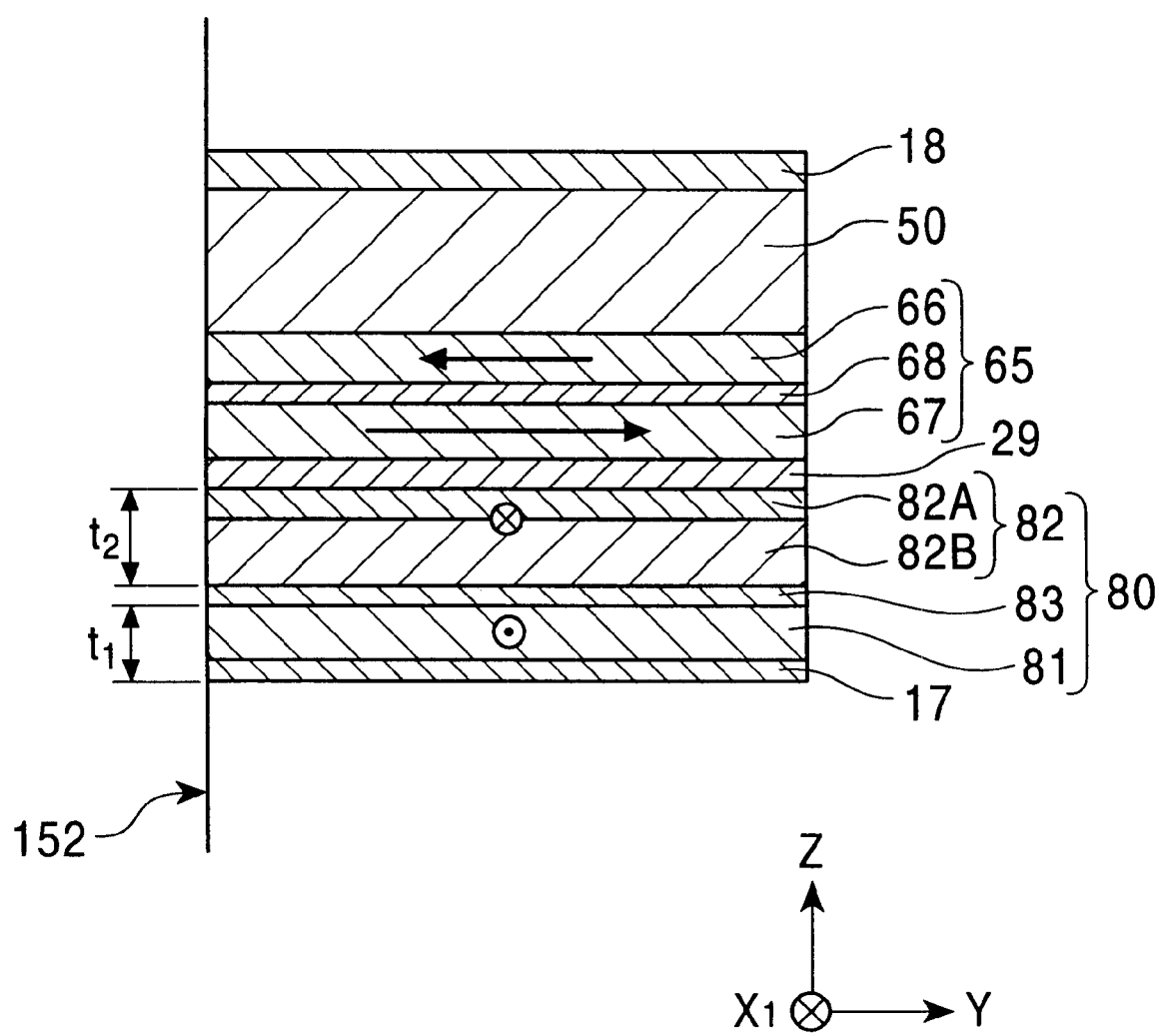
FIG. 14 is a schematic sectional view of the spin valve thin film magnetic element shown in FIG. 13 viewed from a track width direction.
Figure 15:
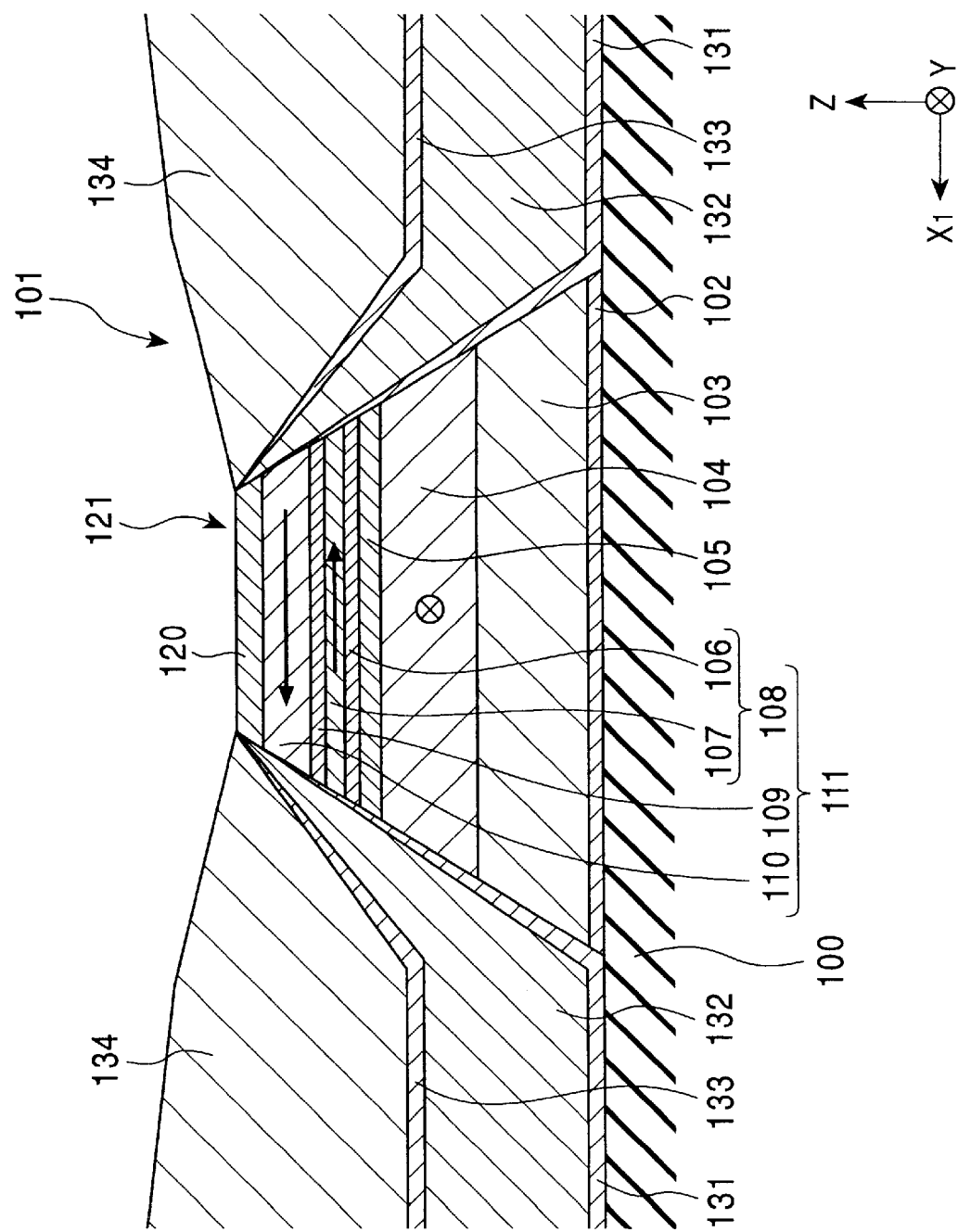
FIG. 15 is a schematic sectional view of a conventional spin valve thin film magnetic element viewed from a magnetic recording medium side.

FIG. 13 is a schematic sectional view of a spin valve thin film magnetic element 4 according to the fourth embodiment of the present invention viewed from a magnetic recording medium side, and FIG. 14 is a schematic sectional view of the spin valve thin film magnetic element 4 viewed from a track width direction.

Among constituent elements shown in FIG. 13 and FIG. 14, the constituent elements which are the same as the constituent elements shown in FIG. 1, FIG. 2, and FIG. 9 to FIG. 12, are indicated by the same reference numerals as in FIG. 1, FIG. 2, and FIG. 9 to FIG. 12, and explanations thereof are omitted or simplified.

In FIG. 13 and FIG. 14, the Z direction shown in the drawings is a direction of movement of the magnetic recording medium, the Y direction shown in drawings is a direction of a leakage magnetic field of the magnetic recording medium, and the $X_1$ direction shown in drawings is the track width direction of the spin valve thin film magnetic element 4.

The spin valve thin film magnetic element 4 shown in FIG. 13 and FIG. 14 is, similarly to the spin valve thin film magnetic element 1 according to the first embodiment, provided in the thin film magnetic head $h_1$, to constitute a floating magnetic head.

The spin valve thin film magnetic element 4 is a top type single spin valve thin film magnetic element constituted by orderly laminating a free magnetic layer 80, a nonmagnetic conductive layer 29, a pinned magnetic layer 65, and an antiferromagnetic layer 50.

In FIG. 13, the numeral 164 shows a lower gap layer, and the numeral 17 shows a substrate layer laminated on the lower gap layer 164. The free magnetic layer 80 is laminated on the substrate layer 17, the nonmagnetic conductive layer 29 is laminated on the free magnetic layer 80, the pinned magnetic layer 65 is laminated on the nonmagnetic conductive layer 29, the antiferromagnetic layer 50 is laminated on the pinned magnetic layer 65, and a cap layer 18 is laminated on the antiferromagnetic layer 50.

Thus, each layer from the substrate layer 17 to the cap layer 18 is orderly laminated to constitute a laminate 14, having a width matching the track width, and having a nearly trapezoidal shape in sectional view.

The free magnetic layer 80 is composed of a nonmagnetic intermediate layer 83, and the first free magnetic layer 81 and the second free magnetic layer 82, holding the nonmagnetic intermediate layer 83 therebetween, and being antiferromagnetically coupled to enter the ferrimagnetic state.

The pinned magnetic layer 65 is composed of a nonmagnetic layer 68, and the first pinned magnetic layer 66 and the second pinned magnetic layer 67 holding the nonmagnetic layer 68 therebetween.

The spin valve thin film magnetic element 4 is different from the aforementioned spin valve thin film magnetic element 3 in that the first free magnetic layer 81 is composed of a single layer made of the NiFeX alloy or the CoMT alloy.

A pair of bias layers 32 and 32 is formed on both sides of the laminate 14 in the $X_1$ direction shown in the drawings. The bias layers 32 and 32 are formed, going aground on both sides 14A and 14A of the laminate 14 from the upper side of the lower gap layer 164.

Conductive layers, shown by the numerals 34 and 34, are laminated above the bias layers 32 and 32. The conductive layers 34 and 34 apply a sensing current to the laminate 14.

Bias substrates 31 are provided between the bias layers 32 and 32, and the lower gap layer 164, and between the bias layers 32 and 32, and the laminate 14. Intermediate layers 33 and 33 are provided between the bias layers 32 and 32, and the conductive layers 34 and 34.

As shown in FIG. 13 and FIG. 14, the free magnetic layer 80 is composed of a nonmagnetic intermediate layer 83, and the first free magnetic layer 81 and the second free magnetic layer 82 holding the nonmagnetic intermediate layer 83 therebetween.

The first free magnetic layer 81 is provided on the side farther from the nonmagnetic conductive layer 29 than the nonmagnetic intermediate layer 83, and is in contact with the substrate 17. On the other hand, the second free magnetic layer 82 is provided on the side nearer to the nonmagnetic conductive layer 29 than the nonmagnetic intermediate layer 83, and is in contact with the nonmagnetic conductive layer 29.

This is constituted so that the resistivity of the first free magnetic layer 81 is higher than the resistivity of the second free magnetic layer 82. That is, materials constituting the first and second free magnetic layers 81 and 82 are properly selected so that the material of the first free magnetic layer 81 has a higher resistance than the material of the second free magnetic layer 82.

The thickness $t_2$ of the second free magnetic layer 82 is preferably formed to be greater than the thickness $t_1$ of the first free magnetic layer 81.

The thickness $t_1$ of the first free magnetic layer 81, as a whole, is preferably within the range 0.5 to 3 nm.

The first free magnetic layer 81 is preferably composed of the NiFeX alloy or the CoMT alloy having a higher resistivity than Co, the CoFe alloy, the NiFe alloy, the CoNi alloy, and the CoNiFe alloy, where the element X is one or more elements selected from the group consisting of Cr, V, Nb, Hf, Ta, Mo, and W, the element M is one of Zr and Hf, or both, and the element T is one of Nb and Ta, or both.

The first free magnetic layer 81 may be constituted so that a part adjacent to the nonmagnetic intermediate layer 83 is made of a NiFe alloy phase, a part in the side farther from the nonmagnetic intermediate layer 83 is made of either a NiFeX alloy phase or a CoMT alloy phase, and a composition of a part held between said NiFe alloy phase, and said NiFeX alloy phase or CoMT alloy phase, is gradually changed from the NiFe alloy phase to the NiFeX alloy phase or CoMT alloy phase, as the distance from the nonmagnetic intermediate layer is increased.

The nonmagnetic intermediate layer 83 is formed from a nonmagnetic material, and is preferably formed from one selected from the group consisting of Ru, Rh, Ir, Cr, Re, and Cu, or an alloy thereof. In particular, it is preferably formed from Ru.

The second free magnetic layer 82 is composed of a diffusion preventing layer 82A and the third ferromagnetic layer 82B. The diffusion preventing layer 82A is made of a ferromagnetic material, and is formed from, for example, Co. The diffusion preventing layer 82A prevents the mutual diffusion of the third ferromagnetic layer 82B and the nonmagnetic conductive layer 29.

The diffusion preventing layer 82A and the third ferromagnetic layer 82B are composed of materials equivalent to the diffusion preventing layer 22A and the third ferromagnetic layer 22B explained in the first embodiment.

The thickness $t_2$ of the second free magnetic layer 82 is preferably within the range 1.5 to 4.5 nm.

The NiFeX alloy and the CoMT alloy, constituting the first free magnetic layer 81, have a higher resistivity than Co, the CoFe alloy, the NiFe alloy, the CoNi alloy, and the CoNiFe alloy, constituting the second free magnetic layer 82 (the diffusion preventing layer 82A and the third ferromagnetic layer 82B). Each composition of the NiFeX alloy and the CoMT alloy is similar to the composition explained in the first embodiment.

Therefore, the resistivity of the first free magnetic layer 81 becomes higher than the resistivity of the second free magnetic layer 82, and the sensing current becomes difficult to flow through the first free magnetic layer 81.

Therefore, the sensing current, flowing through the laminate 14, flows primarily through the nonmagnetic conductive layer 29, the pinned magnetic layer 65, and the second free magnetic layer 82 to suppress the shunt of the sensing current.

Because the giant magnetoresistive effect of the spin valve thin film magnetic element 4 is, similarly to the spin valve thin film magnetic element 1 according to the first embodiment, generated at the boundaries of the nonmagnetic conductive layer 29, and the second free magnetic layer 82 and the pinned magnetic layer 65, by constituting the first free magnetic layer 81 with a high resistivity material and constituting it so that the sensing current flows at the periphery of the nonmagnetic conductive layer 29, the conduction electrons, contributing to the giant magnetoresistive effect, may be increased and the rate of change in magnetoresistance may be increased.

The thickness $t_2$ of the second free magnetic layer 82 is preferably formed to be greater than the thickness $t_1$ of the first free magnetic layer 81.

In particular, when the saturation magnetization of the first free magnetic layer 81 and the second free magnetic layer 82 are indicated by $M_1$ and $M_2$, respectively, and the magnetic film thickness of the first free magnetic layer 81 and the second free magnetic layer 82 are indicated by $M_1 \cdot t_1$ and $M_2 \cdot t_2$, respectively, it is more preferably constituted so that the magnetic film thickness of the first free magnetic layer 81 and the magnetic film thickness of the second free magnetic layer 82 are made to fulfill the relation $M_2 \cdot t_2 > M_1 \cdot t_1$.

Thus, when the thickness or magnetic film thickness of the second free magnetic layer 82 is greater than the thickness or magnetic film thickness of the first free magnetic layer 81, the first free magnetic layer 81 and the second free magnetic layer 82 are antiferromagnetically coupled, and as shown in FIG. 13 and FIG. 14, the direction of magnetization of the second free magnetic layer 82 is oriented in the $X_1$ direction shown in the drawings, by the bias layers 32 and 32, the direction of magnetization of the first free magnetic layer 81 is oriented in the direction opposite to the $X_1$ direction.

When the magnetic film thickness of the first and second free magnetic layers 81 and 82 are made to fulfill the relation $M_2 \cdot t_2 > M_1 \cdot t_1$, it enters the state where the magnetization of the second free magnetic layer 82 remains, and the direction of magnetization of the free magnetic layer 80, as a whole, is oriented in the $X_1$ direction shown in the drawings.

Thus, the first free magnetic layer 81 and the second free magnetic layer 82 enters the artificial ferrimagnetic state (synthetic ferrimagnetic state).

The free magnetic layer 80, thus made to enter the ferrimagnetic state, can have its direction of magnetization turned, even by a very weak external magnetic field, in accordance with the direction of the external magnetic field.

By making the magnetic film thickness of the first free magnetic layer 81 and the second free magnetic layer 82 fulfill the relation $M_2 \cdot t_2 > M_1 \cdot t_1$, the spin flop magnetic field of the free magnetic layer 80 can be increased, and the free magnetic layer 80 can stably maintain the ferrimagnetic state.

In the case in which a part in contact with the nonmagnetic intermediate layer 83, of the first free magnetic layer 81, is made of a NiFe alloy phase, as the NiFe alloy has a higher saturation magnetic flux density than the NiFeX alloy or the CoMT alloy, and is ferromagnetic, the first free magnetic layer 81 and the second free magnetic layer 82 are likely to be antiferromagnetically coupled; then, it is possible to make the first free magnetic layer 81 and the second free magnetic layer 82 enter the ferrimagnetic state.

The antiferromagnetic layer 50 is preferably formed from a PtMn alloy. The PtMn alloy is superior in corrosion resistance properties, have a high blocking temperature, and have a large exchange coupling magnetic field, compared to the NiMn alloy and the FeMn alloy being conventionally used as antiferromagnetic layers. The antiferromagnetic layer 50 has a composition equivalent to the antiferromagnetic layer explained in the third embodiment.

The pinned magnetic layer 65 is composed of a nonmagnetic layer 68, and the first pinned magnetic layer 66 and the second pinned magnetic layer 67 holding said nonmagnetic layer 68 therebetween. The first pinned magnetic layer 66 is provided in the side nearer to the antiferromagnetic layer 50 than the nonmagnetic layer 68, and is in contact with the antiferromagnetic layer 50. The second pinned magnetic layer 67 is provided in the side nearer to the nonmagnetic conductive layer 29 than the nonmagnetic layer 68, and is in contact with the nonmagnetic conductive layer 29.

On the boundary of the first pinned magnetic layer 66 and the antiferromagnetic layer 50, an exchange coupling magnetic field (an exchange anisotropic magnetic field) is generated, and the direction of magnetization of the first pinned magnetic layer 66 is pinned in the direction opposite to the Y direction shown in the drawings.

The thickness of the second pinned magnetic layer 67 is made to be greater than the thickness of the first pinned magnetic layer 66.

The direction of magnetization of the first pinned magnetic layer 66 is pinned in the direction opposite to the Y direction shown in the drawings by the exchange coupling magnetic field with the antiferromagnetic layer 50. The second pinned magnetic layer 67 is antiferromagnetically coupled to the first pinned magnetic layer 66, and its direction of magnetization is pinned in the Y direction shown in the drawings.

Because the directions of magnetization of the first and second pinned magnetic layers 66 and 67 are made to be antiparallel to each other, magnetic moments of the first and second pinned magnetic layers 66 and 67 are in a relation offset to each other. However, as the thickness of the second pinned magnetic layer 67 is slightly greater, a spontaneous magnetization of the pinned magnetic layer 65 itself results in it slightly remaining to be in the ferrimagnetic state. Then, the spontaneous magnetization is further amplified by the exchange coupling magnetic field with the antiferromagnetic layer 50 to pin the direction of magnetization of the pinned magnetic layer 65 in the Y direction shown in the drawings.

The first pinned magnetic layer 66 and the second pinned magnetic layer 67 are both formed from ferromagnetic materials, and are made of materials equivalent to the first and second pinned magnetic layers 26 and 27 as explained in the first embodiment. The nonmagnetic layer 68 is formed from nonmagnetic materials, and is made of materials equivalent to the nonmagnetic layer 28 as explained in the first embodiment.

The nonmagnetic conductive layer 29 prevents the magnetic coupling of the pinned magnetic layer 65 and the free magnetic layer 80, and is a layer through which the sensing current primarily flows. The layer 29 is preferably formed from a conductive nonmagnetic material represented by Cu, Cr, Au, Ag, etc., and in particular, is preferably formed from Cu.

The spin valve thin film magnetic element 4 is manufactured in a similar manner to the spin valve thin film magnetic element 1 according to the first embodiment, except that the substrate layer 17, the free magnetic layer 80 (the first free magnetic layer 81, the nonmagnetic intermediate layer 83, and the second free magnetic layer 82), the nonmagnetic conductive layer 29, the pinned magnetic layer 65 (the second pinned magnetic layer 67, the nonmagnetic layer 68, and the first pinned magnetic layer 66), the antiferromagnetic layer 50, and the cap layer 18 are orderly formed into films to form the laminated film on the lower gap layer 164.

According to the spin valve thin film magnetic element 4, effects nearly similar to the spin valve thin film magnetic element according to the second embodiment can be obtained.

As mentioned above in detail, according to the spin valve thin film magnetic element of the present invention, because in the free magnetic layer wherein the first free magnetic layer and the second free magnetic layer are antiferromagnetically coupled to become the ferrimagnetic state, the resistivity of the first free magnetic layer in the side farther from the nonmagnetic intermediate layer is higher than the resistivity of the second free magnetic layer in the nonmagnetic intermediate layer side, a sensing current (a detection current) is difficult to flow through the first free magnetic layer. Therefore, the shunt of the sensing current is suppressed, the shunt loss is reduced, and the rate of change in magnetoresistance of the spin valve thin film magnetic element may be increased.

In the spin valve thin film magnetic element of the present invention, the first free magnetic layer is composed of the first ferromagnetic layer in contact with the nonmagnetic intermediate layer, and the second ferromagnetic layer in contact with said first ferromagnetic layer, wherein the first ferromagnetic layer is antiferromagnetically coupled to the second free magnetic layer holding the nonmagnetic intermediate layer therebetween, and the resistivity of the second ferromagnetic layer is higher than the resistivity of the first ferromagnetic layer. Therefore, the first free magnetic layer itself can be antiferromagnetically coupled to the second free magnetic layer to enter the ferrimagnetic state, and the shunt loss of the sensing current can be reduced by increasing the resistivity of the first free magnetic layer, as a whole.

By constituting the first free magnetic layer with either the NiFeX alloy or the CoMT alloy, the resistivity of the first free magnetic layer can be increased to suppress the shunt loss of the sensing current, and to increase the rate of change in magnetoresistance.

Even in a case in which the first ferromagnetic layer is made of the NiFe alloy, and the second ferromagnetic layer is made of either the NiFeX alloy or the CoMT alloy, the resistivity of the first free magnetic layer can be increased to suppress the shunt loss of the sensing current, to increase the rate of change in magnetoresistance, and it is possible to ensure that the first free magnetic layer and the second free magnetic layer enter the ferrimagnetic state.

Furthermore, in a case in which a part of the first free magnetic layer adjacent to the nonmagnetic intermediate layer is made of the NiFe alloy phase, and a part in the far side from the nonmagnetic intermediate layer is made of either the NiFeX alloy phase or the CoMT alloy phase, and a composition of a part held between the NiFe alloy phase, and the NiFeX alloy phase or CoMT alloy phase, is gradually changed from the NiFe alloy phase to the NiFeX alloy phase or CoMT alloy phase, as the distance from said nonmagnetic intermediate layer is increased, the resistivity of the first free magnetic layer can be increased to suppress the shunt loss of the sensing current, to increase the rate of change in magnetoresistance, and it is possible to ensure that the first free magnetic layer and the second free magnetic layer enter the ferrimagnetic state.

What is claimed is:

1. A spin valve thin film magnetic element comprising:
   an antiferromagnetic layer;
   a pinned magnetic layer formed in contact with said antiferromagnetic layer, in which the direction of magnetization is pinned by an exchange coupling magnetic field with said antiferromagnetic layer;
   a nonmagnetic conductive layer in contact with said pinned magnetic layer; and
   a free magnetic layer in contact with said nonmagnetic conductive layer,
   wherein said free magnetic layer is composed of a nonmagnetic intermediate layer, and the first and second free magnetic layers holding said nonmagnetic intermediate layer therebetween;
   wherein said first free magnetic layer and said second free magnetic layer are antiferromagnetically coupled to enter the ferrimagnetic state;
   wherein said first free magnetic layer comprises one of a NiFeX alloy and a CoMT alloy where X is at least one element selected from the group consisting of Cr, V, Nb, Hf, Ta, Mo, and W, M is at least one element selected from the group consisting of Zr and Hf, and T is at least one element selected from the group consisting of Nb and Ta; and
   wherein said second free magnetic layer is composed of a single-layer film made of one selected from the group consisting of Co, a CoFe alloy, a NiFe alloy, a CoNi alloy, and a CoNiFe alloy, or is composed of a multilayer film in which two or more kinds of said single-layer films are laminated.

2. A spin valve thin film magnetic element according to claim 1, wherein said first free magnetic layer is composed of the first ferromagnetic layer in contact with said nonmagnetic intermediate layer, and the second ferromagnetic layer is in contact with said first ferromagnetic layer; wherein said first ferromagnetic layer is antiferromagnetically coupled to said second free magnetic layer holding said nonmagnetic intermediate layer therebetween; and wherein said first ferromagnetic layer is made of a NiFe alloy and said second ferromagnetic layer is made of either a NiFeX alloy, where X is one or more elements selected from the group consisting of Cr, V, Nb, Hf, Ta, Mo, and W, or a CoMT alloy, where M is one of Zr and Hf, or both, and T is one of Nb and Ta, or both.

3. A spin valve thin film magnetic element according to claim 1, wherein said first free magnetic layer is made of either a NiFeX alloy, where X is one or more elements selected from the group consisting of Cr, V, Nb, Hf, Ta, Mo, and W, or a CoMT alloy, where M is one of Zr and Hf, or both, and T is one of NB and Ta, or both.

4. A spin valve thin film magnetic element according to claim 1, wherein said thin film magnetic element is constituted so that a part adjacent to said nonmagnetic intermediate layer, of said first free magnetic layer, is made of a NiFe alloy phase; and a part in the side farther from said nonmagnetic intermediate layer is made of either a NiFeX alloy phase, where X is one or more elements selected from the group consisting of Cr, V, Nb, Hf, Ta, Mo, and W, or a CoMT alloy phase, where M is one of Zr and Hf, or both, and T is one of Nb and Ta, or both; and a composition of a part held between said NiFe alloy phase, and said NiFeX alloy phase or CoMT alloy phase, is gradually changed from the NiFe alloy phase to the NiFeX alloy phase or CoMT alloy phase, as the distance from said nonmagnetic intermediate layer is increased.

5. A spin valve thin film magnetic element according to claim 3, wherein said NiFeX alloy is represented by the formula $Ni_aFe_bX_c$, where X is one or more elements selected from the group consisting of Cr, V, Nb, Hf, Ta, Mo, and W, and a, b, and c are compositions being within the ranges 60 atom $\%\leq a \leq 90$ atom %, 5 atom $\%\leq b \leq 30$ atom %, and 0 atom $\%< c \leq 15$ atom %.

6. A spin valve thin film magnetic element according to claim 3, wherein said CoMT alloy comprising an amorphous phase as a primary phase, and is represented by the formula $CO_dM_eT_f$, where M is one of Zr and Hf, or both, T is one of Nb and Ta, or both, and d, e, and f are compositions within the ranges 78 atom $\%\leq d \leq 92$ atom %, e=g(100-d) atom %, f=(100-d-e) atom %, and said g is within the range $0.1 \leq g \leq 0.5$.

7. A spin valve thin film magnetic element according to claim 2, wherein the thickness s of said first ferromagnetic layer is within the range 0 nm<s$\leq 1$ nm.

8. A spin valve thin film magnetic element according to claim 1, wherein said antiferromagnetic layer is made of either an alloy represented by the formula X—Mn, where X is an element selected from the group consisting of Pt, Pd, Ru, Ir, Rh, and Os, or an alloy represented by the formula X'—Pt—Mn, where X' is one or more elements selected from the group consisting of Pd, Cr, Ni, Ru, Ir, Rh, Os, Au, and Ag.

9. A spin valve thin film magnetic element according to claim 1, wherein said pinned magnetic layer is composed of a nonmagnetic layer, and the first and second pinned magnetic layers holding said nonmagnetic layer therebetween; directions of magnetization of said first and second pinned magnetic layers are made antiparallel; and said first and second pinned magnetic layers are made to enter the ferrimagnetic state.

10. A thin film magnetic head providing a spin valve thin film magnetic element according to claim 1.

11. A spin valve thin film magnetic element according to claim 2, wherein said NiFeX alloy is represented by the formula $Ni_aFe_bX_c$, where X is one or more elements selected from the group consisting of Cr, V, Nb, Hf, Ta, Mo, and W, and a, b, and c are compositions being within the ranges 60 atom $\%\leq a \leq 90$ atom %, 5 atom $\%\leq b \leq 30$ atom %, and 0 atom $\%< c \leq 15$ atom %.

12. A spin valve thin film magnetic element according to claim 4, wherein said NiFeX alloy is represented by the formula $Ni_aFe_bX_c$, where X is one or more elements selected from the group consisting of Cr, V, Nb, Hf, Ta, Mo, and W, and a, b, and c are compositions being within the ranges 60 atom $\%\leq a \leq 90$ atom %, 5 atom $\%\leq b \leq 30$ atom %, and 0 atom $\%< c \leq 15$ atom %.

13. A spin valve thin film magnetic element according to claim 2, wherein said CoMT alloy comprising an amorphous phase as a primary phase, and is represented by the formula $CO_dM_eT_f$, where M is one of Zr and Hf, or both, and T is one of Nb and Ta, or both, and d, e, and f are compositions being within the ranges 78 atom $\%\leq d \leq 92$ atom %, e=g(100-d) atom %, f=(100-d-e) atom %, and said g is within the range $0.1 \leq g \leq 0.5$.

14. A spin valve thin film magnetic element according to claim 4, wherein said CoMT alloy comprising an amorphous phase as a primary phase, and is represented by the formula $CO_dM_eT_f$, where M is one of Zr and Hf, or both, and T is one of Nb and Ta, or both, and d, e, and f are compositions being within the ranges 78 atom $\%\leq d \leq 92$ atom %, e=g(100-d) atom %, f=(100-d-e) atom %, and said g is within the range $0.1 \leq g \leq 0.5$.

* * * * *